US008934275B2

(12) United States Patent
Temesi et al.

(10) Patent No.: US 8,934,275 B2
(45) Date of Patent: Jan. 13, 2015

(54) SWITCHING LOSS REDUCTION IN CONVERTER MODULES

(75) Inventors: Ernö Temesi, Nagykovácsi (HU); Michael Frisch, Unterhaching (DE)

(73) Assignee: Vincotech GmbH, Unterhaching (DE)

(*) Notice: Subject to any disclaimer, the term of this patent is extended or adjusted under 35 U.S.C. 154(b) by 258 days.

(21) Appl. No.: 13/472,686

(22) Filed: May 16, 2012

(65) Prior Publication Data

US 2012/0294056 A1 Nov. 22, 2012

(30) Foreign Application Priority Data

May 16, 2011 (EP) .................................... 11004045

(51) Int. Cl.
H02M 7/487 (2007.01)
H03K 17/0812 (2006.01)
H02M 1/34 (2007.01)

(52) U.S. Cl.
CPC ... H03K 17/08128 (2013.01); H02M 2001/348 (2013.01)
USPC .............................. 363/131; 363/43

(58) Field of Classification Search
CPC ........................................................ H02M 7/487
USPC .............................. 363/131, 132, 43
See application file for complete search history.

(56) References Cited

U.S. PATENT DOCUMENTS

| 5,130,917 A | 7/1992 | Shekhawat |
| 5,260,607 A | 11/1993 | Kinbara |
| 5,414,613 A | 5/1995 | Chen |
| 6,169,672 B1 | 1/2001 | Kimura et al. |
| 6,597,590 B2 * | 7/2003 | Ikimi et al. ................. 363/58 |
| 2009/0257255 A1 | 10/2009 | Zhang |
| 2011/0080147 A1 * | 4/2011 | Schoenlinner et al. ....... 323/282 |

FOREIGN PATENT DOCUMENTS

| CN | 1168021 | 12/1997 |
| CN | 101980437 | 2/2011 |
| CN | 101999205 | 3/2011 |
| DE | 2639589 | 3/1978 |
| DE | 3241086 | 5/1984 |

(Continued)

OTHER PUBLICATIONS

Japanese Office Action for Japanese Patent Application No. 2012-110607 dated Sep. 17, 2013 (3 pages).

(Continued)

*Primary Examiner* — Harry Behm
*Assistant Examiner* — Matthew Grubb
(74) *Attorney, Agent, or Firm* — Michael Best & Friedrich LLP

(57) ABSTRACT

The invention relates to converters for converting a DC input voltage a DC or an AC output voltage. The converters have a parasitic inductance. The converters comprise at least one switching element connected to an input terminal for providing a first voltage at an output terminal. In order to allow temporarily storing, in a capacitor, energy induced by the parasitic inductance when switching OFF the switching element, a first series circuit of a diode and a capacitor is provided in the converter, wherein the diode is coupled to the one input terminal. An active circuit coupled in parallel with the diode enables controlling the release of temporarily stored energy from the capacitor of the first series circuit.

4 Claims, 18 Drawing Sheets

(56) References Cited

FOREIGN PATENT DOCUMENTS

| EP | 0419230 | 3/1991 |
|---|---|---|
| JP | H05161253 | 6/1993 |
| JP | H08168236 | 6/1996 |
| JP | H10248243 | 9/1998 |
| JP | H11136954 | 5/1999 |
| JP | 2006345666 | 12/2006 |
| JP | 2008079403 | 4/2008 |
| WO | 9801939 | 1/1998 |
| WO | 2009/126728 | 10/2009 |

OTHER PUBLICATIONS

Extended European Search Report from the European Patent Office for Application No. 1100405.8 dated Apr. 3, 2012 (8 pages).

Finney et al, "The RCD Snubber revisited," Industry Applications Society Anuual Meeting, 1993, Conference Record of the 1993 IEEE Toronto, Ont., Canada Oct. 2-8, 1993, New York, NY, USA, IEEE, Oct. 2, 1993, pp. 1267-1273.

Tardiff et al., "A Summary of resonant snubber circuits for transistors and GTOs," IEEE, Oct. 1, 1989, pp. 1176-1180.

Peng et al., "A passive soft-switching snubber for pwm inverters," Power Electronics Specialists Conference, vol. 1, Jun. 23, 2002, pp. 129-134.

Qian et al., "A High-Efficiency Grid-Tie Battery Energy Storage System" IEEE Power Electronics Conference, vol. 26 No. 3, Mar. 2011, pp. 886-890.

Chinese Patent Office Action for Application No. 2012102687688 dated Jun. 6, 2014 (29 pages—Including translation).

* cited by examiner

# SWITCHING LOSS REDUCTION IN CONVERTER MODULES

BACKGROUND OF THE INVENTION

The invention relates to a converter circuit for converting a DC input voltage to a DC or to an AC output voltage. In particular, the invention relates to reducing the switching losses in the converter for converting a DC input voltage to provide a DC or an AC output voltage at the output terminal thereof.

These days, there exists a high demand for highly efficient power converters, for instance, for use as solar converters, in power generators, or as power converters for high speed motor drives, for switched-mode power supplies or for uninterruptible power supplies.

For this purpose, it is known to employ switching regulators to convert between a DC input and a DC output voltage or to convert between a DC input voltage and an AC output voltage.

SUMMARY OF THE INVENTION

Although there are various different implementations of for switching regulators, all switching regulators share the similarity of including at least one switching element. An example for a DC/DC switching regulator is shown in FIG. 13 and examples for DC/AC switching regulators are shown in FIGS. 14-16.

Referring to FIG. 13, the DC/DC switching regulator converts the DC input voltage supplied via input terminals 1301 and 1302 to a lower DC output voltage. For this purpose, a controller controls switching element 1304 to change between a conducting and a non-conducting state. When switching ON switching element 1304, current flows from input terminal 1301 to output terminal 1303, to which an load (e.g. a series circuit of $R_{load}$ and $L_{load}$) is connected. When switching OFF the switching element 1304, the current supplied via switching element 1304 ceases and the voltage at the output terminal drops to a neutral voltage.

In case of an inductive load, as indicated in FIG. 13 by inductor $L_{load}$, when switching OFF of the switching element 1304 a current is induced by the inductor $L_{load}$ which may circle between diode 1305, $R_{load}$ and $L_{load}$. The induced current is often referred to as freewheeling current and the diode provided for carrying the freewheeling current as freewheeling diode 1305.

In FIG. 14 a half-bridge converter is shown with two input terminals 1401, 1402 for alternatively providing a high voltage and a low voltage at the output terminal 1403. Conventionally, a first input terminal 1401 is supplied with a positive voltage and, hence, referred to as positive input terminal 1401; and a second input terminal 1402 is supplied with a negative voltage and referred to as negative input terminal 1042.

For providing an AC current at the output, the half-bridge converter utilizes two switching element 1404, 1405 alternately switching ON the first switching element 1404 for supplying positive voltage supplied and the second switching element 1405 for supplying a negative voltage at the output terminal 1403.

Each of the two switching elements of the half-bridge converter of FIG. 14 includes a body-diode for carrying a freewheeling current induced by an inductive load. In particular, in case of an inductive load, switching OFF the first or second switching element 1404, 1405 triggers an induced freewheeling current, which may be carried by the body-diode of the complementary switching element 1405 or 1404.

In FIG. 15, a DC/AC switching regulator is shown which is similar to a half-bridge converter of FIG. 14. In particular, the switching regulator includes a first and second switching element 1504 and 1505 respectively coupled between a positive or a negative input terminal 1501, 1502 and an output terminal 1503. By alternately switching the first and the second switching element 1504 and 1505, the switching regulator of FIG. 15 provides a AC current at the output.

The DC/AC switching regulator further includes a neutral circuit 1530 of two reversely coupled switching elements for intermittently providing a neutral voltage of a neutral terminal 1506 at the output terminal 1503. Depending on a pre-charge state at the output terminal 1503, when switching ON the appropriate of the two switching elements of the neutral circuit 1530, current is enabled to flow between the output terminal 1503 and the neutral terminal 1506 or vice versa.

The DC/AC switching regulator of FIG. 15 may also be referred to as mixed voltage NPC (neutral point clamped) converter because switching elements 1505 and 1505 require a voltage rating allowing to withstand the full input voltage (i.e. the difference of the positive voltage and the negative voltage of the positive and negative input terminal 1501 and 1502) whereas switching elements of the series circuit 1530 only require approximately half the voltage rating.

Referring now to FIG. 16, a conventional NPC converter is shown comprising a first switching element 1604 connected to a positive input terminal 1601 and a second switching element 1605 connected to a negative input terminal 1602. The first and second switching element 1604, 1605 enable providing a positive and a negative voltage with respect to a neutral terminal 1060 at the output terminal 1603.

In the NPC converter, the first and second switching elements 1604, 1605 are coupled via neutral circuit 1630 to the output terminal 1603. In particular, the neutral circuit 1630 includes a third switching element coupled between the first switching element 1604 and the output terminal 1603, and includes a fourth switching element coupled between the second switching element 1605 and the output terminal 1603.

Due to the third and fourth switching element of the neutral circuit 1630 connecting the respective first and second switching element 1604, 1605 to the output terminal 1603, a controller has to control switching ON the first and third switching element at the same time and also has to control switching ON the second and fourth switching element at the same time. In more detail, the controller controlling the switching of the first, second, third an fourth switching elements, is configured so that the third switching element remains ON for at least the same time period that the first switching element 1604 is ON and that the fourth switching element remains ON for at least the same time period that the second switching element 1605 is ON.

Additionally, the third and fourth switching elements are controlled to be intermittently ON (i.e. the respective first or second switching element is OFF, so that the neutral circuit 1630 provides a neutral voltage at the output terminal 1603.

In more detail, when switching ON the third switching element of the neutral circuit 1630 and the first switching element 1604 is OFF, a current can flow from the neutral terminal 1606 through a diode and the third switching element of the neutral circuit 1630 to the output terminal 1603. Similarly, when switching ON the fourth switching element of the neutral circuit 1630 and the second switching element 1605 is OFF, a current can flow from the output terminal 1603 through a diode and the fourth switching element of the neutral circuit 1630 to the neutral terminal 1606.

All of the above described switching regulators are subject to switching losses as will become apparent from the following analysis. In a switching regulator, the switching losses can be classified as turn-ON losses and turn-OFF losses. Under real life conditions, the turn-ON losses depend ON switching element parameters (e.g. gate charge losses of a transistor) a parasitic inductance of the switching regulator and reverse recovery losses. The turn-OFF losses mainly also depend on switching element parameters and the serial inductance whereas the forward characteristic of the freewheeling element is mostly negligible.

Referring now in detail to FIG. 13. When switching ON the switching element 1304, a current starts flowing from the first input terminal 101 through parasitic inductance $L_{parasiti}$ and switching element 1304 to the output terminal 1303. For a current to flow through switching element 1304, the gate capacitance of the switching element 1304 has to be charged, resulting in gate charge losses. At the same time, the freewheeling element 1305 (e.g. freewheeling diode) requires a substantial amount of reverse charges to recover to the blocking state, resulting in reverse recovery losses. Since the parasitic inductance $L_{parasiti}$ delays the current with respect to the voltage, the switching ON speed of the switching element 1304 is negatively affected by the parasitic inductance.

Further, it can be appreciated that the parasitic inductance also influences the reverse recovery losses. The reverse recovery time of a diode is defined as the time a forward conducting diode takes to recover to a blocking state upon the voltage across it suddenly reversing. During this reverse recovery period, a temporary short circuit may result in a large reverse current, and a large power dissipation.

In FIG. 13, the freewheeling diode 1305 can recover at a lower peak current due to the parasitic inductance $L_{parasiti}$ slowing down the change rate of the current. The lower peak current corresponds to a lower change rate dv/dt of the drain to source voltage of the switching element 1304 when the freewheeling diode recovers to the blocking state. Consequently, the reverse recovery losses decrease during turn ON.

When switching OFF switching element 1304, the turn-OFF losses are mainly dependent on the capability to force the switching element 1304 to a non-conducting state and the speed of the freewheeling element's transition to an ON state. In the transition period, current may flow through the switching element 1304 and freewheeling element 1305 contributing to the turn-OFF losses. As an inductive load additionally forces current to flow through switching element 1304, the serial inductance of the load also contributes to the turn-OFF losses.

The above analysis of turn-ON and turn-OFF losses does not only apply to the switching regulator of FIG. 13.

All switching regulators, for instance the switching regulators illustrated in FIGS. 13 to 16, are subject to the same or similar effects and, hence, may be subject to improvements for reducing the switching losses.

One object underlying the invention is to improve the efficiency of switching regulators converting between a DC and a DC voltage or converting between a DC and an AC voltage.

Another object of the invention is to reduce the reverse recovery losses in switching regulators with complementary switching stages.

A further object underlying the invention is to reduce the adverse effects of parasitic inductance in a power module design.

Switching losses of switching regulators do not only depend on the built-in parameters and the control of the switching regulator but are also influenced by the surrounding circuit design. Parasitic inductances, for instance, which are present in every power electronic circuit, also affect the switching losses of a regulator.

During turn ON, a switching regulator benefits from the effect of a parasitic inductance resulting in a reduction of the turn-ON losses switching regulator. However, the switching regulator suffers from the effect of a parasitic in a similar manner. Therefore, a first aspect of the invention is to suggest a rerouting of a current induced by the parasitic inductance during turn OFF in order to prevent the switching regulator to suffer from adverse affects. In particular, when switching ON the switching regulator, a parasitic inductance temporarily stores energy in a magnetic field. The parasitic inductance contributes to reducing the reverse recovery losses in a switching regulator. When switching OFF the switching regulator, the temporarily stored energy is induced by the parasitic inductance again into the switching regulator increasing the turn-OFF losses in the switching regulator. For this purpose, the switching regulators according to the invention employ a series circuit to temporarily store the energy induced by the parasitic inductance and an active circuit controlling the release of the temporarily stored energy, optionally feeding the temporarily stored energy back to input, resulting in an overall improved efficiency of the switching regulators.

Another aspect of the invention is to suggest the modification of a multi-stage switching regulator by decoupling the different stages with an inductor, optionally an artificially generated parasitic inductance. A switching stage of a switching regulator provides a predefined supply voltage at the output. For switching multiple voltages, e.g. in a DC/AC converter, different switching stages are required. According to this second aspect, the different switching stages are inductively decoupled from each other so as to prevent from cross conduction losses during turn-ON of one of the switching stages.

A further, third aspect of the invention is to suggest grouping components of a switching regulator on different power substrates or in different power modules minimizing the inductive coupling among components of a group while allowing an inductive coupling between components of different groups. The inductive coupling may be utilized for improving the efficiency of a switching regulator or as substitution for an inductor resulting in a cost reduction of a switching regulator.

In an exemplary embodiment according to the second and third aspect of the invention, the switching stages of a multi-stage switching regulator are grouped on different power substrates or in different power modules, the inductive coupling among the different switching stages providing for the effect of inductively decoupling the different switching stages so as to prevent from cross-conduction losses in the multi-stage switching regulator.

One embodiment of the invention is proving a DC/DC converter for converting a DC input voltage, supplied via a first and a second input terminal to a DC output voltage at an output terminal. The DC/DC converter has a parasitic inductance. The DC/DC converter comprises a switching element connected to one of the first or second input terminal for providing a first voltage at the output terminal; and a freewheeling element coupled between the other input terminal and the output terminal allowing a freewheeling current to flow through the output terminal. The DC/DC converter further includes a first series circuit of a diode and a capacitor, wherein the diode is coupled to the one input terminal and allows temporarily storing, in the capacitor, energy induced by the parasitic inductance when switching OFF the switching element. An active circuit coupled in parallel with the diode of the first series circuit is further included in the DC/DC converter for controlling the release of temporarily stored energy from the capacitor of the first series circuit.

In one exemplary implementation, the first series circuit of the DC/DC converter is either coupled between the first input terminal and the second input terminal or coupled between the first terminal and a third input terminal, the first and the third input terminal supplying the same first voltage.

In a more detailed implementation, the active circuit of the DC/DC converter comprises a second series circuit of an inductor and a resistor which are connected in parallel to the diode of the first series circuit. The active circuit prevents temporarily stored energy from being released from the capacitor of the first series circuit when switching ON the switching element. Further, the active circuit enables releasing the temporarily stored energy of the capacitor by at least partially dissipating temporarily stored energy in the resistor when switching OFF the switching element.

In an detailed alternative embodiment, the active circuit of the DC/DC converter comprises a resistor with a first terminal connected to a node interconnecting the diode and the capacitor of the first series circuit, and with a second terminal connected to the first input terminal. The active circuit prevents temporarily stored energy from being released from the capacitor of the first series circuit when switching ON the switching element. Further, the active circuit enables releasing the temporarily stored energy of the capacitor by at least partially dissipating temporarily stored energy in the resistor when switching OFF the switching element.

In another detailed embodiment, the active circuit of the DC/DC converter comprises an intermediate converter with a first and a second terminal connected in parallel to the diode of the first series circuit, and with a third terminal connected to the second input terminal. The intermediate converter is controlled so as to prevent temporarily stored energy from being released from the capacitor of the first series circuit when switching ON the switching element. The intermediate converter is further controlled so as to convert the temporarily stored energy of the capacitor of the first series circuit based ON the externally supplied DC input voltage for supplying the converted energy to the first input terminal when switching OFF the switching element.

In a further, more detailed embodiment, the intermediate converter of the DC/DC converter includes an inductor in the connection to the first input terminal or the intermediate converter utilizes high voltage components.

In another alternative embodiment, the active circuit of the DC/DC converter comprises an intermediate converter with a first terminal connected to a node interconnecting the diode and the capacitor of the first series circuit, with a second terminal connected to the first input terminal, and with a third terminal connected to the second input terminal. The intermediate converter is controlled so as to prevent temporarily stored energy from being released from the capacitor of the first series circuit when switching ON the switching element. The intermediate converter is further controlled so as to convert the temporarily stored energy of the capacitor of the first series circuit based ON the externally supplied DC input voltage for supplying the converted energy to the first input terminal when switching OFF the switching element.

Another embodiment of the invention is providing a half-bridge converter for converting a DC input voltage, supplied via a positive and a negative input terminal as a positive and a negative voltage, to an AC output voltage at an output terminal. The half-bridge converter has a parasitic inductance. The half-bridge converter comprises a first switching element connected to the positive input terminal for providing a positive voltage at the output terminal; and a second switching element connected to the negative input terminal for providing a negative voltage at the output terminal. The half-bridge converter further comprises a first series circuit of a first diode, a capacitor and a second diode. The first series circuit is coupled between the positive and the negative input terminal, wherein the first diode allows temporarily storing, in the capacitor, energy induced by a parasitic inductance when switching OFF the first switching element, and the second diode allows temporarily storing, in the capacitor, energy induced by the or by another parasitic inductance when switching OFF the second switching element. An active circuit coupled in parallel with the first series circuit is further comprised in the half-bridge converter for controlling the release of temporarily stored energy from the capacitor of the first series circuit.

In one exemplary implementation, the active circuit includes of the half-bridge converter comprises a second series circuit of a first resistor and a first inductor, the second series circuit being connected in parallel to the first diode of the first series circuit, and comprises a third series circuit of a second resistor and a second inductor, the third series circuit being connected in parallel to the second diode of the first series circuit. The first active circuit prevents temporarily stored energy from being released from the capacitor of the series circuit when switching ON the respective first or second switching element. Further, the active circuit enables releasing the temporarily stored energy of the capacitor of the first series circuit by at least partially dissipating temporarily stored energy in the first or second resistor when switching OFF the respective first or second switching element.

In another exemplary implementation, the active circuit of the half-bridge converter comprises an intermediate converter with a first and second terminal connected in parallel to the first diode of the first series circuit and with a third and fourth terminal connected in parallel to the second diode of the first series circuit. The intermediate converter is controlled so as to prevent temporarily stored energy from being released from the capacitor of the first series circuit (510) when switching ON the first or second switching element. The intermediate converter is further controlled so as to convert the temporarily stored energy of the capacitor of the first series circuit based on the externally supplied DC input voltage for supplying the converted energy to the first or second input terminal when switching OFF the respective first or second switching element.

In a more detailed implementation, the half-bridge converter includes an output circuit comprising a first and a second inductor respectively coupled between the first and second switching element and the output terminal. The half-bridge converter further includes a first diode connected with its cathode to the positive input terminal and with its anode to a first node, the first node connecting the second switching element and the output circuit; and a second diode connected with its anode to the negative input terminal and with its cathode to a second node, the second node connecting the first switching element and the output circuit.

A further embodiment of the invention is to provide a neutral point clamped (NPC) converter for converting a DC input voltage, supplied via a positive and a negative input terminal as a positive and a negative voltage with respect to a neutral terminal, to an AC output voltage at an output terminal. The NPC converter has a parasitic inductance. The NPC converter comprises a first switching element connected to the positive input terminal for providing via an output circuit a positive voltage at the output terminal; and a second switching element connected to the negative input terminal for providing via the output circuit a negative voltage at the output terminal. The output circuit comprises a first and a second inductor respectively coupled between the first and second switching element and the output terminal. A neutral point switching circuit comprised in the NPC converter and coupled between the neutral terminal and the output circuit is for providing a neutral voltage at the output terminal. The NPC converter further comprises a first series circuit of a first diode and a first capacitor, the first series circuit being coupled between the positive input terminal and the neutral terminal, wherein the first diode allows temporarily storing, in the first capacitor, energy induced by the parasitic inductance when switching OFF the first switching element; and a second series circuit of a second diode and a second capacitor, the second series circuit being coupled between the negative input terminal and the neutral terminal, wherein the second diode allows temporarily storing, in the second capacitor, energy induced by the or another parasitic inductance when switching OFF the second switching element. A first active circuit comprised in the NPC converter and coupled in parallel with the first diode of the first series circuit is for controlling the release of temporarily stored energy from the first capacitor of the first series circuit; and a second active circuit also comprised in the NPC converter and coupled in parallel with the second diode of the second series circuit is for controlling the release of temporarily stored energy from the second capacitor of the second series circuit.

In an exemplary implementation, the first and the second active circuit of the NPC converter respectively comprise a third and fourth series circuit, each including a resistor and an inductor, connected in parallel to the respective first and second diode of the first or second series circuit. The first and second active circuits prevent temporarily stored energy from being released from the respective first or second capacitor of the first or second series circuit when switching ON the respective first or second switching element. The first and second active circuits release the temporarily stored energy of the respective first and second capacitor of the first and second series circuit by at least partially dissipating temporarily stored energy in the respective resistor when switching OFF the respective first or second switching element.

In one alternative implementation, the first and second active circuit of the NPC converter comprise a first and second intermediate converter, each of the first and second intermediate converters is with a first and a second terminal connected in parallel to the respective first or second diode of the first or second series circuit, and with a third terminal connected to the neutral terminal. The first and second intermediate converter is controlled so as to prevent temporarily stored energy from being released from the respective first or second capacitor of the first and second series circuit when switching ON the respective first or second switching element. The first and second intermediate converter is further controlled so as to convert the temporarily stored energy of the respective first or second capacitor of the first or second series circuit based on the externally supplied DC input voltage for supplying the converted energy to the respective first input or second input terminal when switching OFF the respective first or second switching element.

In a more detailed implementation, the NPC converter comprises a first circuit comprising at least one first diode coupled between the positive input terminal and a first node though which the second switching element provides the negative voltage to the output circuit. The at least one first diode enables current to pass from the output circuit to the positive input terminal. The NPC converter further comprises, a second circuit comprising at least one second diode coupled between the negative input terminal and a second node though which the first switching element provides the positive voltage to the output circuit. The at least one second diode enables current to pass from the negative input terminal to the output circuit.

BRIEF DESCRIPTION OF THE DRAWINGS

For a better understanding of the present invention, same will be explained in the following based on the embodiments shown in the figures. Corresponding parts are given corresponding reference numerals and terms. Furthermore, those features or combinations of features which show or describe different embodiments may form separate inventive solutions in themselves. The invention will now be described by way of example with reference to the drawings, wherein.

DETAILED DESCRIPTION

Figure 1:
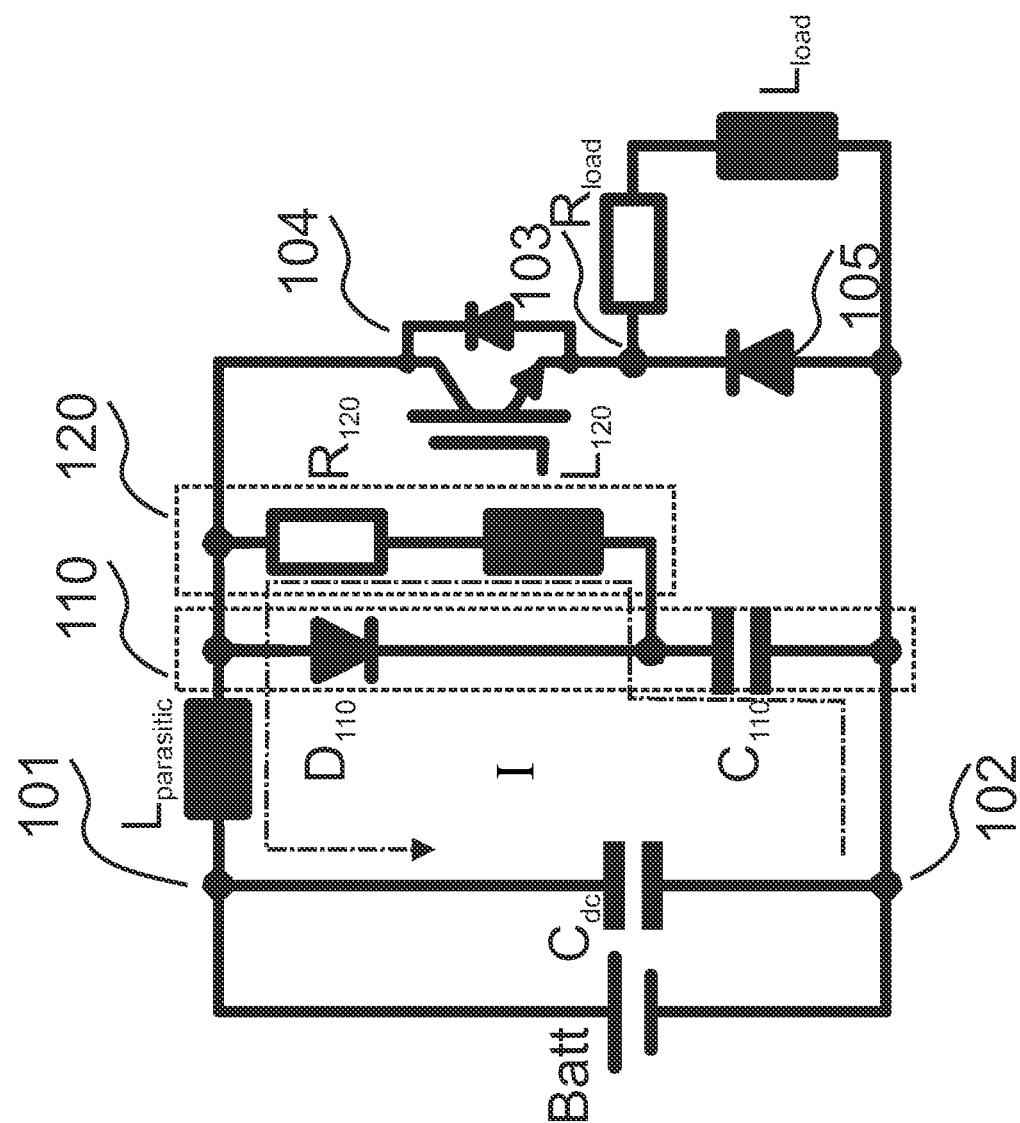
FIG. 1 illustrates a circuit diagram of the DC/DC converter according to an exemplary embodiment of the invention.

Referring to FIG. 1, a circuit diagram of a DC/DC converter according to an exemplary embodiment of the invention is shown. The DC/DC converter of this embodiment can be used for converting a DC to a DC voltage. For this purpose, the DC/DC converter is supplied via the two input terminals 101 and 102 with a DC input voltage.

In the embodiment as shown in FIG. 1, a battery, coupled with a capacitor, is connected between the first and second input terminals 101 and 102. A switching element 104 is connected to the first input terminal 101 for providing a first voltage at the output terminal 103.

In the exemplary embodiment shown in FIG. 1, a load is connected to the output terminal 103 wherein the load is represented by a resistor $R_{load}$ and an inductor $L_{load}$.

The DC/DC converter of FIG. 1 further includes a freewheeling diode 105 coupled between the second input terminal 102 and the output terminal 103. In case of an inductive load, as indicated by inductor $L_{load}$ in the exemplar embodiment of FIG. 1, switching OFF the switching element 104 results in the inductive load $L_{load}$ inducing a freewheeling current. This freewheeling current is conducted by the freewheeling diode 105. In the exemplary embodiment illustrated in FIG. 1, the freewheeling current flows in the conductive loop comprised of freewheeling diode 105, resistor $R_{load}$ and inductor $L_{load}$.

Further, as shown in FIG. 1, the DC/DC converter also includes a parasitic inductor $L_{parasitic}$. The parasitic inductor is shown at the input terminal 101 of the DC/DC converter. The indicated parasitic inductor should, however, only hint towards a parasitic inductance in the DC/DC converter of FIG. 1. Accordingly, the parasitic inductor of the DC/DC converter of FIG. 1 does not correspond to an electrical component (i.e. inductor) with a fixed position but results from various factors and may be assumed inherent to the design.

In the DC/DC converter of FIG. 1, for instance, the parasitic inductance mainly stems from the realization of the connection between the DC input voltage supply and input terminals 101 and 102. In detail, the wiring and the screwed contacts via which the battery was connected to the DC/DC converter module mainly contribute to the parasitic inductance.

When switching ON switching element 104, a current starts flowing between the input terminal 101 and the output terminal 103. The parasitic inductance of the DC/DC converter of FIG. 1 results in a delay of the current with respect to the voltage. In other words, the parasitic inductance reduces the current change rate, hence, advantageously contributing to a reduction of the turn ON losses in the DC/DC converter of FIG. 1.

However, the parasitic inductance adversely affects the turn OFF behavior of the DC/DC converter of FIG. 1. In particular, when switching OFF switching element 104, the parasitic inductance will release energy contained in the magnetic field of the parasitic inductance. The parasitic inductance will force a current to flow through the switching element 104 preventing from its immediate turn OFF.

In this respect, the DC/DC converter of FIG. 1 provides a first series circuit 110 coupled between the first and the second input terminals 101 and 102. The first series circuit comprises a diode D110 and a capacitor C110. The diode D110 has its anode terminal connected to the first input terminal 101.

In more detail, the first series circuit 110 provides an additional conducting loop for the induced current. In particular, the AC component of the current induced by the parasitic inductance $L_{parasitic}$ can circulate in the loop comprising the parasitic inductance $L_{parasitic}$, diode D110, capacitor C110 and the input power supply connected between the input terminals 101 and 102. Accordingly, the induced current may be temporarily stored in capacitor C110 when switching OFF the switching element 104.

Consequently, the first series circuit 110 prevents the current induced by the parasitic inductance during switching OFF the switching element 104 from contributing to the turn OFF losses of the DC/DC converter of FIG. 1.

For converting the temporarily stored energy of capacitor C110 of series circuit 110, the DC/DC converter of the exemplary embodiment shown in FIG. 1 further includes an active circuit 120 coupled in parallel with the diode D110 of the first series circuit 110.

In particular, the active circuit 120 controls the release of the temporarily stored energy of the capacitor C110 of the first series circuit 110 so that it does not eliminate the positive effect of the parasitic inductance when switching ON the switching element 104.

In the DC/DC converter of FIG. 1, the active circuit 120 comprises a series circuit of an inductor L120 and a resistor R120. The series circuit of inductor L120 and resistor R120 is connected in parallel to the diode D110 of the first series circuit 110.

The inductor L120 contributes to the effect of the active circuit preventing temporarily stored energy from being released from the capacitor C110 of the first series circuit 110 when switching ON the switching element 104. For this purpose, the value of inductor L120 is determined based on an estimated or a measured value of the parasitic inductance $L_{parasitic}$ of the DC/DC converter.

In more detail, when switching ON switching element 104, capacitor C110 may still store energy from a previous switching OFF operation of the switching element 104. However, the inductor L120 delays current in a similar manner to that of the parasitic inductance $L_{parasitic}$. Accordingly, the active circuit 120 of inductor L120 and resistor R120 limits the current flow from capacitor C110 to the switching element 104 to a current value well below the current supplied to the switching element 104 via the two input terminals 101 and 102 when switching ON the switching element 104.

The active circuit 120 further controls the release of the temporarily stored energy of capacitor C110 by at least partially dissipating temporarily stored energy in resistor R120 when switching OFF the switching element 104.

In other words, when switching OFF switching element 104, a discharge current starts flowing in a conductive loop comprising capacitor C110, inductor L120, resistor R120 and the DC input voltage supply connected between input terminals 101 and 102. The conductive loop is indicated as loop I in FIG. 1.

Thereby, the temporarily stored energy is released from the capacitor C110 of the first series circuit 110 without adversely affecting the improved turn ON behaviour of the DC/DC converter of FIG. 1.

Consequently, the combination of series circuit 110 and active circuit 120 allows preserving the positive effects of the parasitic inductance of the DC/DC converter of FIG. 1 when switching ON switching element 104, without adverse effects when switching OFF switching element 104.

Figure 2:
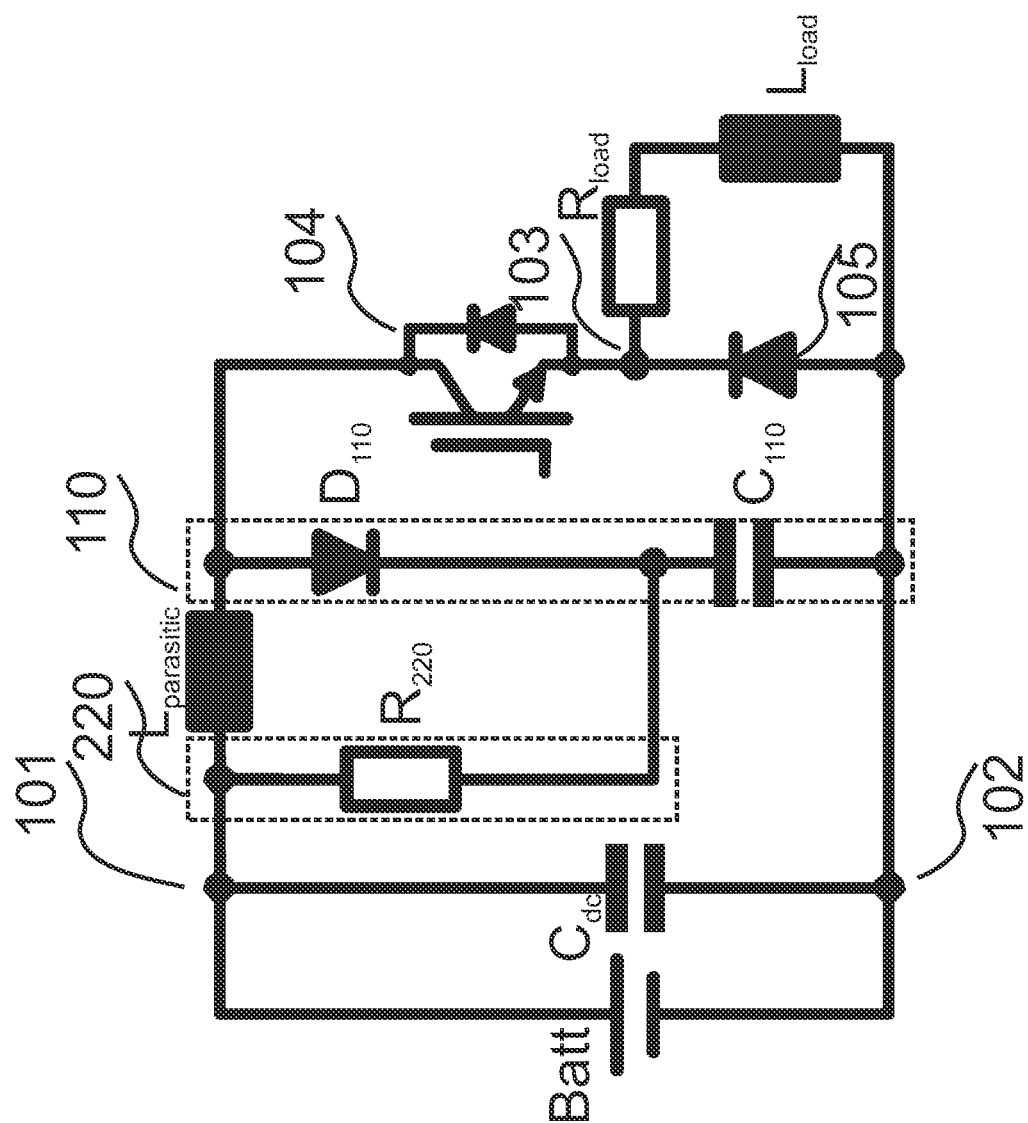
FIG. 2 illustrates a circuit diagram of the DC/DC converter according to another exemplary embodiment of the invention.

Referring now to FIG. 2, a DC/DC converter according to another exemplary embodiment of the invention is illustrated. The DC/DC converter of FIG. 2 is based on the DC/DC converter of FIG. 1 where corresponding parts are given corresponding reference numerals and terms. The detailed description of corresponding parts has been omitted for reasons of conciseness.

The DC/DC converter of FIG. 2 differs from the DC/DC converter of FIG. 1 in the active circuit 220.

In detail, the DC/DC converter of FIG. 2 also includes a first series circuit 110 of a diode D110 and a capacitor C110 coupled between the first and the second input terminals 101 and 102. The diode D110 of the first series circuit 110 also allows temporarily storing, in the capacitor C110, energy induced by the parasitic inductance when switching OFF the switching element 104.

To release the temporarily stored energy of the capacitor C110, the DC/DC converter of FIG. 2 provides an active circuit 220 comprising a resistor R220. The active circuit 220 also controls releasing of the temporarily stored energy of capacitor C110 by at least partially dissipating temporarily stored energy in resistor R120 when switching OFF the switching element 104.

Based on the amount of temporarily stored energy induced by a parasitic inductance, it may be advantageous to provide an active circuit 220 comprising an external resistor R220 (e.g. for providing an externally mounted heat sink).

Accordingly, the active circuit 220 comprises a resistor R220 with a first terminal connected to a node interconnecting diode D110 and capacitor C110 of the first series circuit 110 and with a second terminal externally connected to the first input terminal 101 of the DC/DC converter of FIG. 2. Thus, the active circuit 220 does not require integration into the module of the DC/DC converter of FIG. 2 but can be externally attached thereto.

Further, due to the external connection of the active circuit 220 to the first input terminal 110 of the DC/DC converter of FIG. 2, the active circuit 220 is subject to a similar parasitic inductance as the DC/DC converter of FIG. 2.

Consequently, the active circuit 220 of resistor R220 limits the current flow from capacitor 110 to the switching element 104 to a current value well below the current supplied to the switching element 104 via the two input terminals 101 and 102 when switching ON the switching element 104.

Consequently, the combination of series circuit 110 and active circuit 220 also allows preserving the positive effects of the parasitic inductance of the DC/DC converter of FIG. 2 when switching ON switching element 104, without adverse effects when switching OFF switching element 104.

Figure 3:
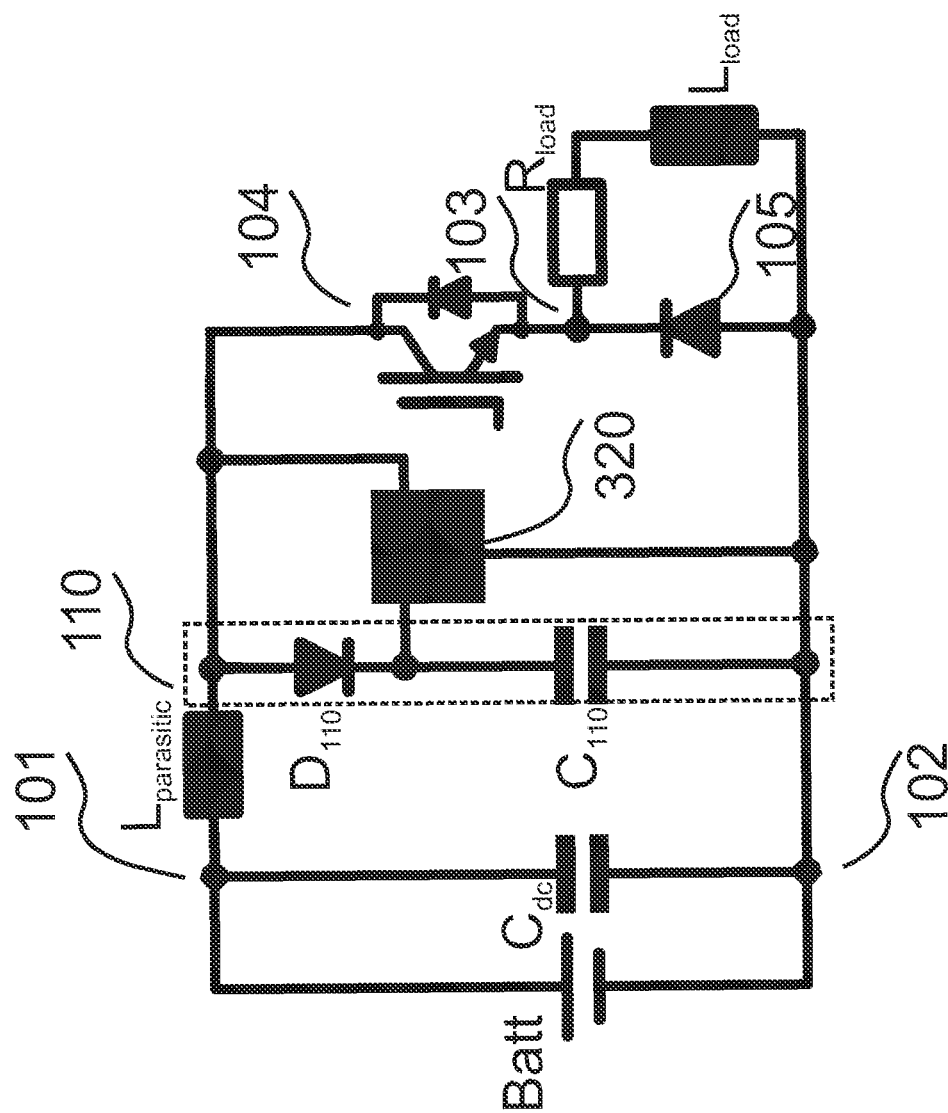
FIG. 3 illustrates a circuit diagram of the DC/DC converter according to a further exemplary embodiment of the invention.

Referring now to FIG. 3, another exemplary embodiment of a DC/DC converter according to the invention is shown. The DC/DC converter of FIG. 3 is based on the DC/DC converters of FIGS. 1 and 2. Corresponding parts are given corresponding reference numerals and terms and have been omitted from the description of the corresponding embodiment.

The exemplary embodiment of a DC/DC converter as shown in FIG. 3 also includes a first series circuit 110 of a diode D110 and a capacitor C110. The first series circuit 110 is coupled between the first and the second input terminal 101 and 102.

When switching OFF the switching element, a parasitic inductance within the DC/DC converter induces a current which is allowed to be temporarily stored in capacitor C110 of the series circuit 110. For this purpose the induced current passes diode D110. The diode D110 is connected with the anode terminal to the first input terminal of the DC/DC converter.

In the particular embodiment, shown in FIG. 3 an intermediate DC/DC converter 320 is utilized as active circuit 320. In particular, the intermediate DC/DC converter 320 is connected by a first and a second terminal in parallel to diode D110 of the first series circuit 110 and is by a third terminal connected to the second input terminal 102. The intermediate DC/DC converter 320 enables controlling the release of the temporarily stored energy of the capacitor of the first series circuit 110.

In particular, the intermediate DC/DC converter 320 may be controlled so as to prevent temporarily stored energy from being released from the capacitor C110 of the first series circuit 110 when switching ON the switching element 104. The intermediate DC/DC converter may be controlled to release the temporarily stored energy of the capacitor C110 prior to switching ON the switching element 104.

In this respect, it may be advantageous for the intermediate DC/DC converter 320 to start converting the energy temporarily stored in capacitor C110 to a DC voltage when switching OFF the switching element.

Converting the temporarily stored energy based on the externally supplied DC input voltage allows feeding back the converted energy to the first input terminal 101. Accordingly, the temporarily stored energy can be regenerated and does not contribute to the switching losses of the DC/DC converter, thus, improving the efficiency thereof.

For the intermediate DC/DC converter 320, there exist multiple different implementations:

First of all, the intermediate DC/DC converter 320 could be implemented as a buck converter with a first terminal connected to a node interconnecting the diode D110 and capacitor C110 of the first series circuit 110 as input terminal, with a second terminal connected to the first input terminal 101 as output terminal, and with a third terminal connected to the second input terminal 102 as reference terminal.

Alternatively, the intermediate DC/DC converter 320 could be realized as buck-boost converter with a first terminal connected to a node interconnecting the diode D110 and the capacitor C110 of the first series circuit 110 as input terminal, with the second terminal connected to the second input terminal 102 as output terminal, and with a third terminal connected to the first input terminal 101 as reference terminal.

Further, the intermediate DC/DC converter 320 could be realized as transformer based booster with a first terminal connected to a node interconnecting the diode D110 and the capacitor C110 of the first series circuit 110, with a second terminal connected to the second input terminal 102 as output terminal, and with a third terminal connected to the first input terminal 101 as reference terminal.

In the above described second and third implementation of the intermediate DC/DC converter, the intermediate DC/DC converters are required to up-convert from a low input voltage between the input terminal and the reference terminal to a high output voltage between the output terminal and the reference terminal. In the above described first implementation, the intermediate DC/DC converter operates as down-converter.

Figure 4:
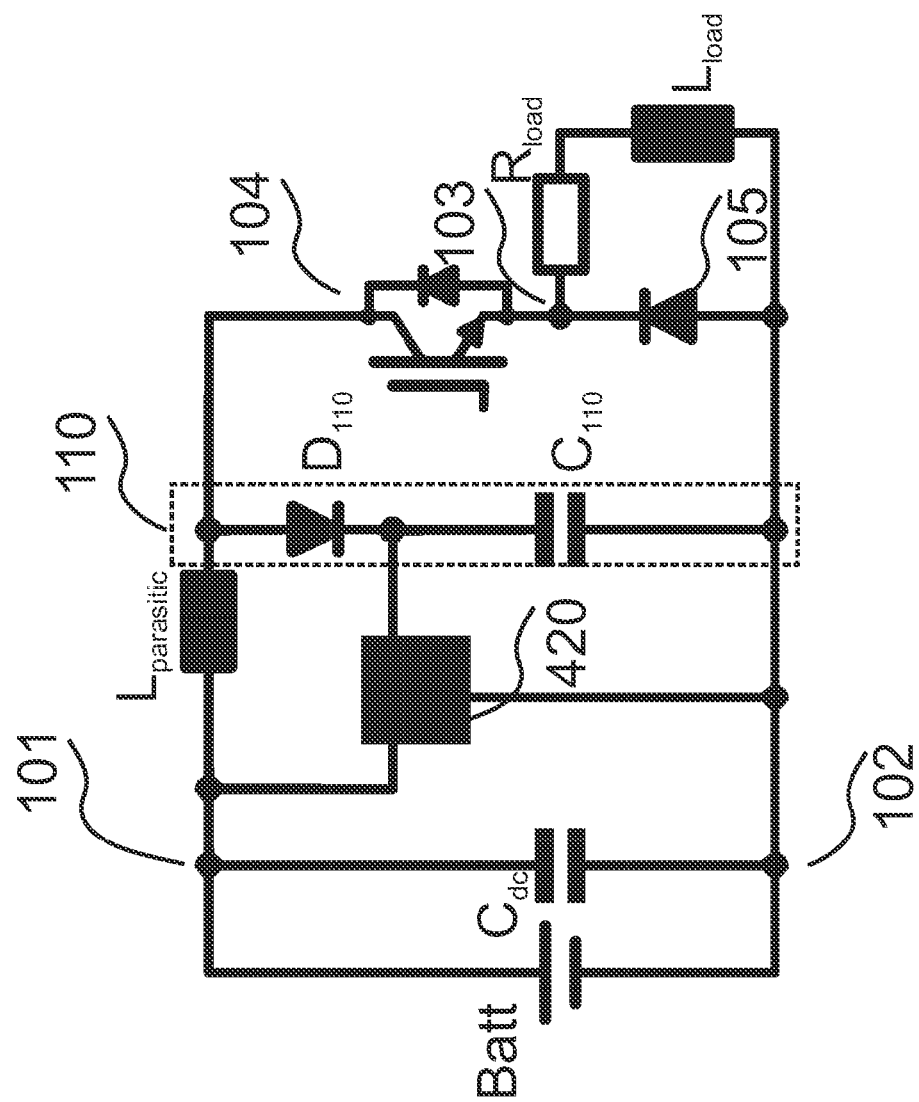
FIG. 4 illustrates a circuit diagram of the DC/DC converter according to yet another exemplary embodiment of the invention.

Referring now to FIG. 4, a further exemplary embodiment of a DC/DC converter according to the invention is shown. The exemplary embodiment of the DC/DC converter of FIG. 4 is based on the DC/DC converter of FIG. 3.

The DC/DC converter of FIG. 4 differs from the DC/DC converter of FIG. 3 in the active circuit.

The DC/DC converter of FIG. 4 also includes a first series circuit 110 of a diode D110 and a capacitor C110. The first series circuit 110 is coupled between the first and second input terminals 101 and 102. In particular, the diode D110 allows the temporary storage of energy induced by the parasitic inductance when switching OFF the switching element 104 in the capacitor C110.

The DC/DC converter of FIG. 4 further includes an intermediate DC/DC converter as an active circuit 430, coupled in parallel with the diode D110 of the first series circuit. The intermediate DC/DC converter according to this embodiment may include components preventing from integration of the intermediate DC/DC converter 420 within the module of or on the power substrate of the DC/DC converter.

For example, when realizing the intermediate DC/DC converter as a buck-boost converter, the required inductor could prevent the DC/DC converter of FIG. 4 on a same substrate from integrating. In this respect, the inductor may be separately provided and externally connected, for instance, to the first input terminal 101 or the second input terminal 102.

The intermediate DC/DC converter of the DC/DC converter of FIG. 4 has a first terminal connected to a node interconnecting the diode D110 and the capacitor C110 of the first series circuit 110 has a second terminal connected externally to the first input terminal 101 and has a third terminal connected to the second input terminal 102.

Alternatively, the intermediate DC/DC converter of the DC/DC converter of FIG. 4 may be provided in a separate module and externally connected to the first input terminal 101 to the second input terminal 102 and to a node interconnecting the diode D110 and the capacitor C110 of the first series circuit 110.

The intermediate DC/DC converter 420 can be implemented as buck converter, buck-boost converter or as transformer with booster as described in connection with FIG. 3.

Figure 5:
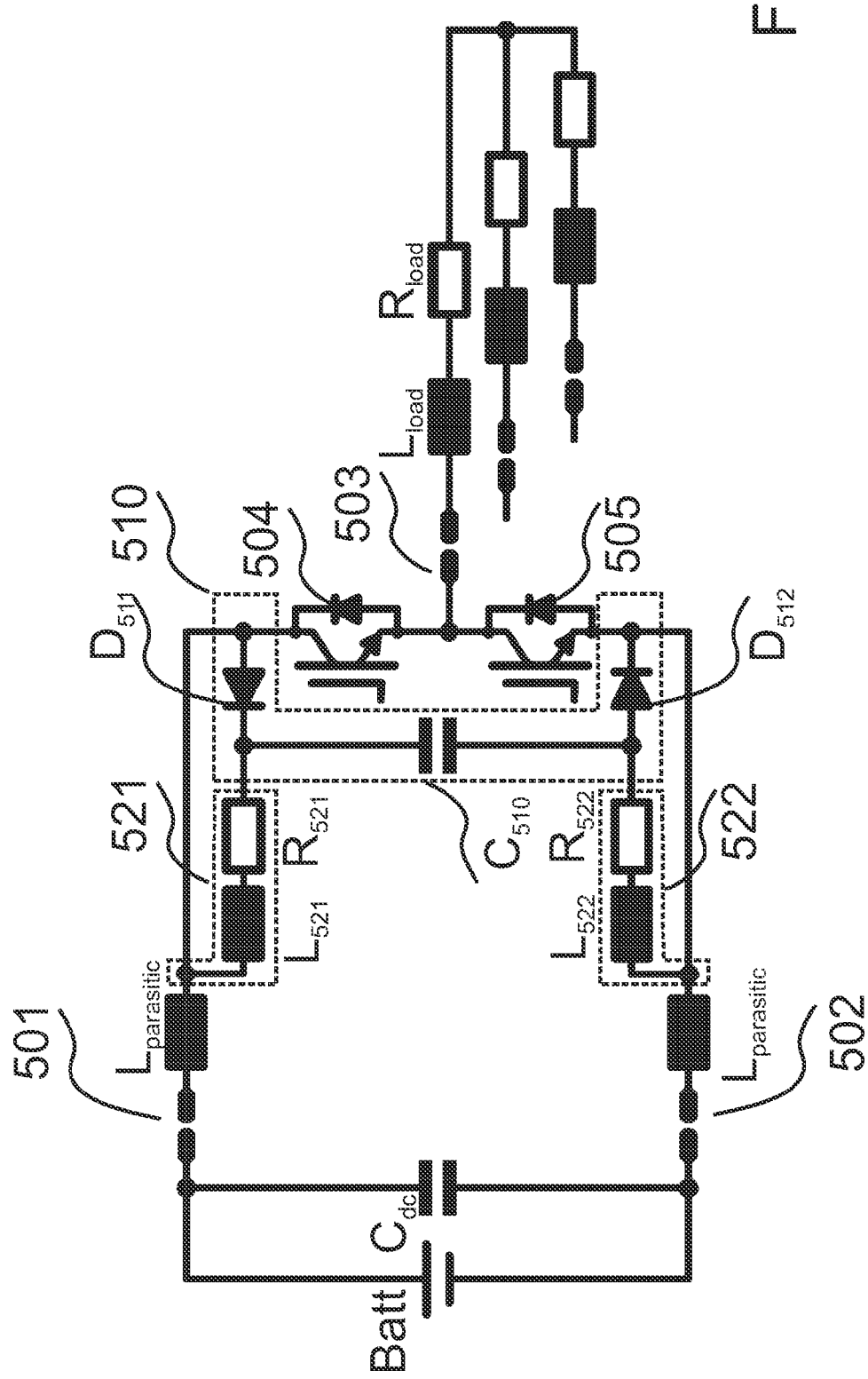
FIG. 5 illustrates a circuit diagram of the half-bridge converter according to an exemplary embodiment of the invention.

Referring now to FIG. 5, an exemplary embodiment of a half-bridge converter according to the invention is shown.

The half-bridge converter of FIG. 5 may be used for converting a DC to an AC voltage. For this purpose, the half-bridge converter is supplied with a positive and a negative DC voltage via two input terminals 501 and 502 to provide a positive or negative voltage at the output terminal 503.

The half-bridge converter further includes a first switching element 504 connected to the positive input terminal 501 and a second switching element 505 connected to the negative input terminal 502.

For sequentially providing a positive and a negative half wave at the output terminal 503, the half-bridge converter is configured to alternately switch ON the first and the second switching elements 504 and 505.

In other words, switching ON the first switching element 504 allows the provision of a positive voltage at the output terminal 503 and switching ON the second switching element 505 allows the provision of a negative voltage at the output terminal 503.

Each of the first and second switching elements 504 and 505 includes a body diode capable of conducting a freewheeling current in the case of an inductive load.

For example, when switching OFF the first switching element 504, an inductive load $L_{load}$ may result in a freewheeling current through the body diode of the second switching element 505. Similarly, when switching OFF the second switching element 505, an inductive load may result in a freewheeling current through the body diode of the first switching element 504.

Further, as shown in FIG. 5, the half-bridge converter also includes a parasitic inductor $L_{parasitic}$. A first parasitic inductor is shown at the positive input terminal 501 of the half-bridge converter and a second parasitic inductor is shown at the negative input terminal 502 of the half-bridge converter of FIG. 5.

The indicated parasitic inductors should, however, only hint towards a parasitic inductance in the half-bridge converter of FIG. 5, as already explained in connection with FIG. 1. Accordingly, the parasitic inductors shown in FIG. 5 do not correspond to electric components, (i.e. inductors) but result from various factors and may be assumed inherent to the design.

When switching ON switching element 504, a current starts flowing between the positive input terminal 501 and the output terminal 503. The parasitic inductance of the half-bridge converter of FIG. 5 results in a delay of the current with respect to the voltage. Same also applies when switching ON switching element 505 of the half-bridge converter of FIG. 5. In other words, the parasitic inductance reduces the current change rate, advantageously contributing to a reduction of the turn ON losses in the half-bridge converter of FIG. 5.

However, the parasitic inductance adversely affects the turn OFF behavior of the half-bridge converter of FIG. 5. In particular, when switching OFF switching element 504, the parasitic inductance releases energy contained in the magnetic field of the parasitic inductance. Thereby, the parasitic inductance forces a current to flow through the switching element 504, resisting its turn OFF. Similarly, when switching OFF switching element 505, the parasitic inductance will also force a current to flow through the switching element 505, preventing from its immediate turn OFF.

To avoid the parasitic inductance from preventing the switching elements 504 and 505 from turning OFF, the half-bridge converter of FIG. 5 provides a first series circuit 510 coupled between the positive and negative input terminals 501 and 502.

The first series circuit 510 comprises a first diode D511, a capacitor C510 and a second diode D512. The first diode D511 has its anode terminal connected to the positive input terminal 501 and in the second diode D512 has its cathode terminal connected to the negative input terminal 502.

Due to the provision of the first series circuit 510 coupled between the positive input terminal 501 and the negative input terminal 502, an induced positive current can be temporarily stored in capacitor D510 when switching OFF the first switching element 504 and an induced negative current can be temporarily stored in capacitor C510 when switching OFF the second switching element 505.

Consequently, the first series circuit 510 prevents current, induced by the parasitic inductance during switching OFF of the switching elements 504 and 505, from contributing to the turn OFF losses of the half-bridge converter of FIG. 5.

The half-bridge converter of FIG. 5 further includes an active circuit 520 coupled in parallel with the first diode D511 and in parallel with the second diode D512 of the first series circuit 510. The active circuit 521, 522 allows controlling the release of temporarily stored energy of the capacitor C510 of the first series circuit so that it does not eliminate the positive effect of the parasitic inductance when switching ON switching element 504 or 505.

In the half-bridge converter of FIG. 5, the active circuit 521 and 522 comprises two series circuits, each comprising an inductor L521, L522 and a resistor R521, R522. The series circuit of inductor L521 and resistor R521 is referred to in the following as second series circuit 521 whereas the series circuit of inductor L522 and resistor R522 is referred to in the following as third series circuit 522 in order to avoid confusion with first series circuit 510.

The second series circuit 521 is connected in parallel to the first diode D511 of the first series circuit 510. The third series circuit 522 is connected in parallel to the diode D512 of the first series circuit 510.

The inductors L521 and L522 contribute to the effect of the active circuit 521 and 522 preventing temporarily stored energy from being released from the capacitor C510 of the first series circuit 510 when switching ON either the first switching element 504 or the second switching element 505. For this purpose, the value of inductance L521 and L522 is determined based on an estimated or a measured value of the parasitic inductance of the half-bridge converter of FIG. 5.

In more detail, as inductors L521 and L522 delay current in a similar manner to that of the parasitic inductance of the half-bridge converter of FIG. 5, the active circuit 521 and 522 achieves limiting the current flow from the capacitor C510 to the switching elements 504 and 505 to a current value well below the current supplied to the switching elements 504 and 505 via the respective positive or negative input terminals 501 and 502 when switching ON the corresponding switching element 504 and 505.

The active circuit 521 and 522 further controls the release of the temporarily stored energy of capacitor C510 by at least partially dissipating temporarily stored energy in the respective resistors R521 or R522 when switching OFF the corresponding switching element 504 and 505.

In other words, when switching OFF either switching element 504 or 505, a discharge current starts flowing from capacitor C510 towards the respective second series circuit 521 or third series circuit 522 so that the corresponding resistors R521 or R522 at least partially dissipate the temporarily stored energy of the capacitor C510.

Consequently, the temporarily stored energy is released from the capacitor C510 of the first series circuit 510 without adversely affecting the improved turn ON behavior of the half-bridge converter of FIG. 1.

Consequently, the combination of first series circuit 510 and active circuit 521 and 522 allows the preservation of the positive effects of the parasitic inductance of the half-bridge converter of FIG. 5 when switching ON switching elements 504 and 505 without adverse effects when switching OFF switching elements 504 and 505.

Figure 6:
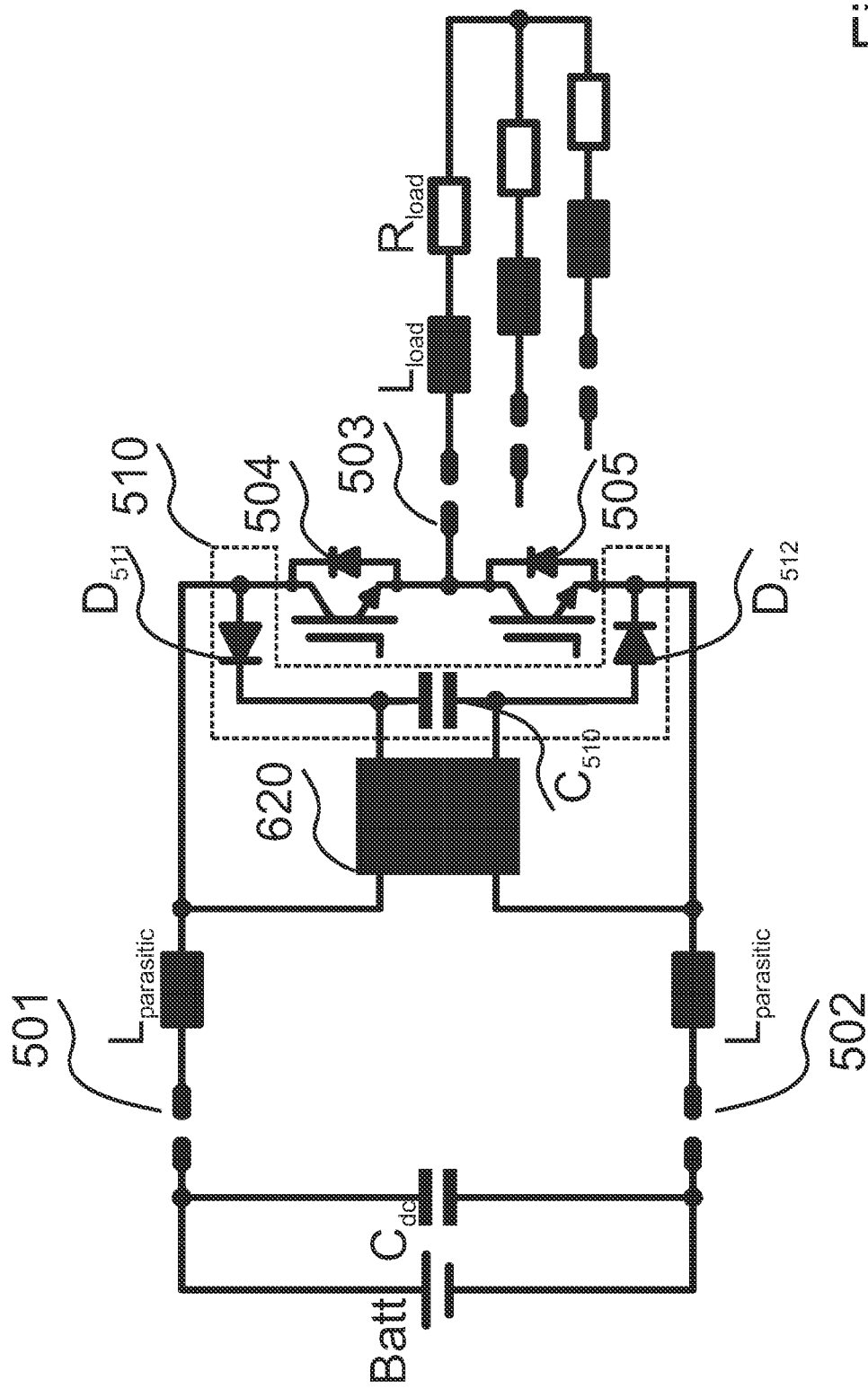
FIG. 6 illustrates a circuit diagram of the half-bridge converter according to another exemplary embodiment of the invention.

Referring now to FIG. 6, a half-bridge converter according to another exemplary embodiment of the invention is illustrated. The half-bridge converter of FIG. 6 is based on the half-bridge converter of FIG. 5, where corresponding parts are given corresponding reference numerals and terms. The detailed description of corresponding parts has been omitted for reasons of conciseness.

The half-bridge converter of FIG. 6 differs from the half-bridge converter of FIG. 5 in the active circuit 620.

In detail, the half-bridge converter of FIG. 6 also includes a first series circuit 110 of a first diode D511, a capacitor C510 and a second diode D512 coupled between the positive and negative input terminals 501 and 502. The diodes D511 and D512 of the first series circuit also allow temporarily storing in the capacitor C510 energy induced by the parasitic inductance when switching OFF either switching element 504 or switching element 505.

To release the temporarily stored energy from the capacitor C510 the half-bridge converter of FIG. 6 provides an active circuit 620 comprising an intermediate DC/DC converter.

The intermediate DC/DC converter 620 of the half-bridge converter of FIG. 6 comprises a first and a second terminal connected in parallel to the first diode D511 of the first series circuit 510 and a third and a fourth terminal connected in parallel to the second diode D512 of the first series circuit 510.

As described in connection with the intermediate DC/DC converter 320 of FIG. 3, commonly known implementations of DC/DC converters can be used for up-converting or down converting the energy stored from the capacitor C510 of the first series circuit 510. Examples for commonly known intermediate DC/DC converters are buck converters, buck-boost converters or transformer based booster circuit.

The intermediate DC/DC converter 620 of FIG. 6 may be controlled so as to prevent temporarily stored energy from being released from the capacitor C510 of the first series circuit 510 when switching ON the first or second switching element 504 or 505.

This can be achieved by controlling the intermediate DC/DC converter 620 so as to prevent current from flowing between the first and second terminal when switching ON the first switching element 504 and to control the intermediate DC/DC converter so as to prevent current from flowing between the third and fourth terminal when switching ON the second switching element 505.

Further, the intermediate DC/DC converter 620 may be controlled so as to convert the temporarily stored energy of the capacitor C510 of the first series circuit 510 based ON the externally supplied DC input voltage for supplying the converted energy to the first or second input terminal 501 or 502 when switching OFF the respective first or second switching element 504 or 505.

In other words, upon detecting a positive voltage between the first and second terminal of the intermediate DC/DC converter 620, the intermediate DC/DC converter 620 may be controlled so as to convert the contained energy to the DC input voltage supplied via positive and negative input terminals 510 and 520 for supplying the converted energy via the first and third terminal of the intermediate DC/DC converter 620 to the positive and negative input terminals 501 and 502.

Similarly, upon detecting a negative voltage between the third and fourth terminal of the intermediate DC/DC converter 620, the intermediate DC/DC converter 620 may be controlled so as to convert the contained energy to the DC input voltage for supplying the converted energy via the first and third terminals of the intermediate DC/DC converter 620 to the positive and negative input terminals 501 and 502.

Thereby, the intermediate DC/DC converter allows regeneration of the stored energy in the capacitor C510 contributing to an increase of the total efficiency of the half-bridge converter of FIG. 6.

Furthermore, the half-bridge converter according to the invention is not limited to the embodiments as shown in FIGS. 5 and 6.

The half-bridge converter of FIG. 5 can also be adapted in a similar manner to the embodiment of FIG. 2 by substituting the active circuit 521 and 522 with an active circuit comprising a resistor with a first terminal connected to a node interconnecting the diode D511 and the capacitor C510 of the first series circuit 510 and with a second terminal connected to the positive input terminal 501, and with another resistor with a first terminal connected to a node interconnecting the diode D512 and the capacitor C510 of the first series circuit 510 and with a second terminal connected to the negative input terminal 502 in order to allow an external attachment of said resistors.

Further, the half-bridge converter of FIG. 6 can also be adapted in line with the embodiment of FIG. 4 by providing a intermediate DC/DC converter with a first terminal connected to a first node interconnecting diode D511 and capacitor C510, with a second terminal connected to a second node interconnecting the diode D512 and the capacitor C510 of the first series circuit 510, with a third terminal and a fourth terminal connected to the respective positive and negative input terminals 501 and 502, allowing an external or an at least partially external connection of components included in the intermediate DC/DC converter.

Figure 7:
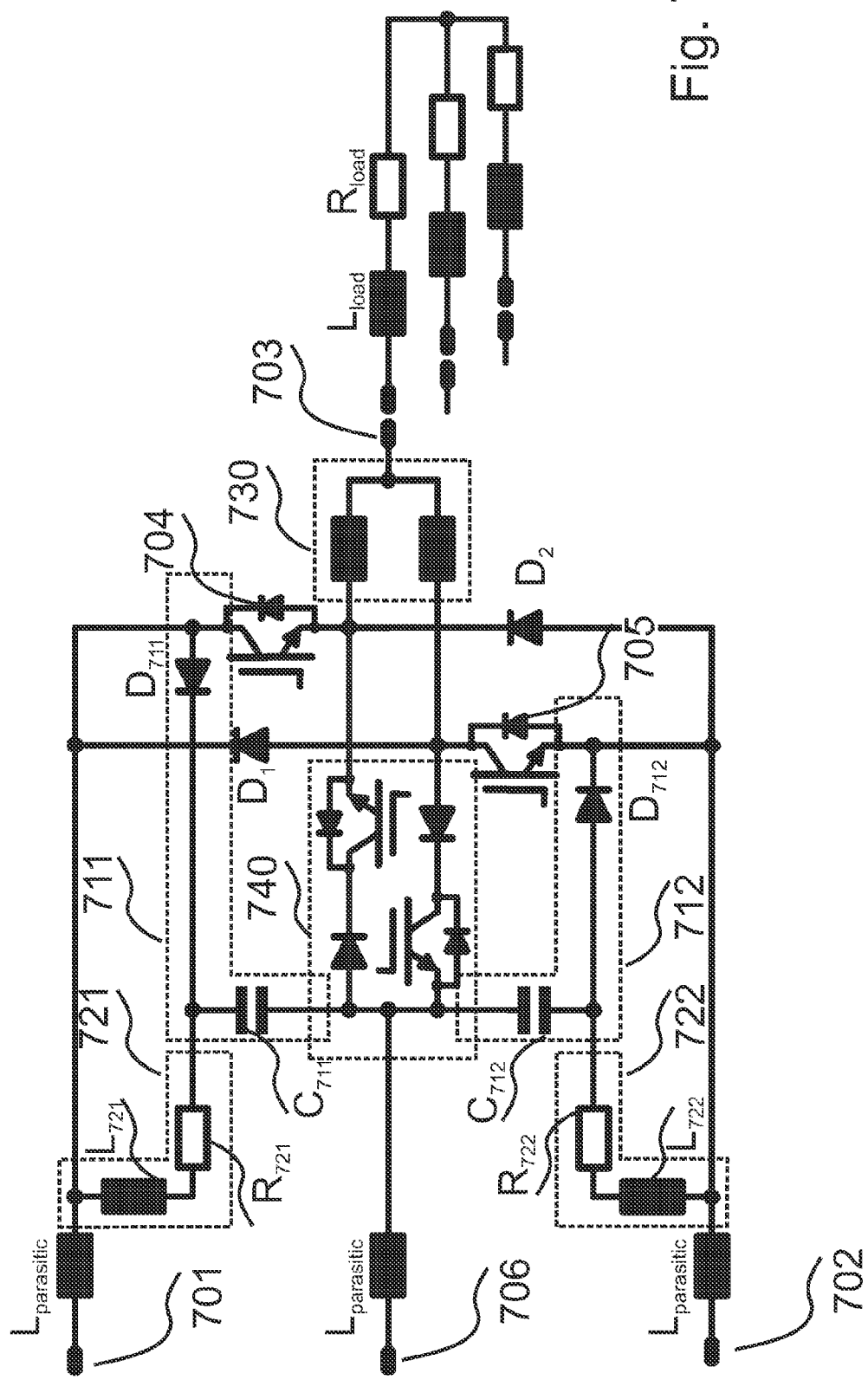
FIG. 7 illustrates a circuit diagram of a mixed-voltage NPC converter according to an exemplary embodiment of the invention.

Referring now to FIG. 7, a mixed-voltage NPC (MNPC) converter according an exemplary embodiment of the invention is shown. The mixed-voltage NPC converter of this embodiment can be used to convert a DC to an AC voltage.

For this purpose, the MNPC converter of FIG. 7 is supplied with a positive and negative DC voltage via a positive and negative input terminal 701 and 702 to provide a positive or negative voltage at the output terminal 703. Further, the MNPC converter of FIG. 7 includes a neutral terminal 706 for supplying a neutral voltage intermediate to the positive and negative voltage at the output terminal 703.

The MNPC converter of FIG. 7 comprises a first switching element 704 connected to the positive input terminal 701 to provide via an output circuit 730 a positive voltage at the output terminal 703. Further, the MNPC converter of FIG. 7 includes a second switching element 705 connected to the negative input terminal 702 to provide a negative voltage at the output terminal 703 via the output circuit 730.

The output circuit 730 of the MNPC converter of FIG. 7 comprises a first and a second inductor, respectively, coupled between the first and second switching elements 704 and 705 and the output terminal 703. In this respect, the first switching element 704 is coupled via the first inductor to the output terminal and the second switching element 705 is coupled via the second inductor to the output terminal 703.

Further the MNPC converter of FIG. 7 includes a neutral point switching circuit 740 coupled between the neutral terminal 706 and the output circuit 730 for providing a neutral voltage at the output terminal 703. The neutral point switching circuit 740 may be realized by two complementary series circuits of a diode and a transistor. The first of the complementary series circuits allows provision of a neutral voltage to the output circuit 730 after switching OFF the first switching element 704 and the second of the complementary series circuits allows provision of a neutral voltage to the output circuit 730 after switching OFF the second switching element 705.

The MNPC converter of FIG. 7 also includes parasitic inductors $L_{parasitic}$. The parasitic inductors are shown at the input terminals 701, 702 and 706. The parasitic inductors should, however, only hint towards a parasitic inductance of the MNPC convertor of FIG. 7. Accordingly, the parasitic inductors of the MNPC converter of FIG. 7 do not correspond to electrical components (i.e., inductors) but result from various factors and may be assumed inherent to the design.

When switching ON the first switching element 704 a current starts flowing between the positive input terminals 701 and the output terminal 703. The parasitic inductance of the MNPC converter of FIG. 7 results in a delay of the current with respect to the voltage. Similarly, when switching ON switching element 705, a current starts flowing between the negative input terminal 702 and the output terminal 703. The parasitic inductance of the MNPC converter of FIG. 7 also results in a delay of the current with respect to the voltage. In other words, the parasitic inductance reduces the current change rate, hence, advantageously contributing to a reduction of the turn ON losses in the MNPC converter of FIG. 7.

However, the parasitic inductance of the MNPC converter of FIG. 7 adversely affects the turn OFF behavior of the MNPC converter.

In particular, when switching OFF either first switching element 704 or the second switching element 705, the parasitic inductance releases energy contained in the magnetic field of the parasitic inductance.

The parasitic inductance, hence, forces the current to flow through the respective first or second switching elements 704 or 705 preventing from its immediate turning OFF.

In this respect, the MNPC converter of FIG. 7 provides a first or second switching series circuit 711 and 712 respectively coupled between the positive input terminal 701 and the neutral terminal 706 or between the negative input terminal 702 and the neutral terminal 706. The first series circuit 711 comprises a diode D711 and a capacitor C711. The diode D711 has its anode terminal connected to the positive input terminal 701. The second series circuit 712 comprises a diode D712 and a capacitor C712. The diode D712 has its cathode connected to the negative input terminal 702.

In more detail, the first series circuit 711 provides an additional conducting loop allowing a current induced by parasitic inductance $L_{parasitic}$ to circulate in the loop comprising the parasitic inductance $L_{parasitic}$, diode D711 capacitor C711 and the DC input voltage supplied between input terminals 701 and 706. The second series circuit 712 also provides a conducting loop allowing a current induced by the parasitic inductance $L_{parasitic}$ to circulate in the loop comprising parasitic inductance $L_{parasitic}$, diode D712, capacitor C712 and the DC input power supply between input terminals 702 and 706.

Accordingly, an induced current may be temporarily stored in capacitor C711 when switching OFF the switching element 704 or in the capacitor C712 when switching OFF the switching element 705.

Consequently, the first series circuit 711 and the second series circuit 712 prevent a current induced by the parasitic inductance during switching OFF of the respective switching elements 704 and 705 from contributing to the turn OFF losses of the MNPC converter of FIG. 7.

For converting the temporarily stored energy of capacitor C711 of series circuit 711 and of capacitor C712 of the second series circuit 712, the MNPC converter of FIG. 7 further includes active circuits 721 and 722 respectively coupled in parallel with diodes D711 and D712 of the first or second series circuit 711 and 712.

In particular, the active circuits 721 and 722 control the release of the temporarily stored energy of the corresponding first or second capacitor C711 or C712 so that it does not eliminate the positive effect of the parasitic inductance when switching ON the respective first or second switching elements 704 and 705.

In the MNPC converter of FIG. 7, the first active circuit 721 comprises an inductor L721 and a resistor R721. The series circuit of inductor L721 and resistor R721 is connected in parallel to the diode D711 of the first or second series circuit 711. The second active circuit 722 also comprises a series circuit of an inductor L722 and a resistor R722. The series circuit of the inductor L722 and the resistor R722 is connected in parallel to the diode D712 of the second series circuit 712.

The inductor L721 and the inductor L722 contribute to the effect of the active circuits 721 and 721, namely of prevent temporarily stored energy from being released from the respective capacitors C711 or C712 when switching ON the respective switching elements 704 or 705. For this purpose, the values of each of the inductors L721 and L722 are determined based on an estimated or a measured value of the parasitic inductance of the MNPC converter of FIG. 7.

In more detail, as the inductors L721 and L722 delay current in a similar manner to that of the parasitic inductance, each of the active circuits 721 and 722 limits the current flow from the respective capacitors C711 and C712 to the corresponding switching elements 704 and 705 so that the switching elements 704 and 705 may only be subject to a discharge current value well below the current supplied to the respective switching element 704 or 705 via the corresponding positive or negative input terminals 701 or 702 when switching ON the respective switching elements 704 or 705.

The active circuits 721 and 722 further control the release of the temporarily stored energy of the respective capacitors C711 or C712 by at least partially dissipating the stored energy in the respective resistor R721 or R722 when switching OFF the corresponding switching element 704 or 702.

In other words, when switching OFF switching element 704, a discharge current starts flowing in a conductive loop comprising capacitor C711, inductor L721, resistor R721 and the DC input voltage supply connected between input terminal 701 and 706. Similarly, when switching OFF switching element 705, a discharge current also starts flowing in a conductive loop comprising capacitor C712 inductor L722 and resistor R722 and the DC input voltage supply connected between input terminals 702 and 706.

The temporarily stored energy is thereby released from capacitor C711 of the first series circuit 711 and from capacitor C712 of the second series circuit 712 without adversely affecting the improved turn ON behavior of the MNPC converter of FIG. 7.

Consequently, the combination of the first series circuit 711 and the first active circuit 721 as well as the combination of the second series circuit 712 and the second active circuit 722 allow preserving the positive effects of the parasitic inductance of the MNPC converter of FIG. 7 when switching ON switching elements 704 or 705 without adverse effects when switching OFF switching elements 704 or 705.

Figure 8:
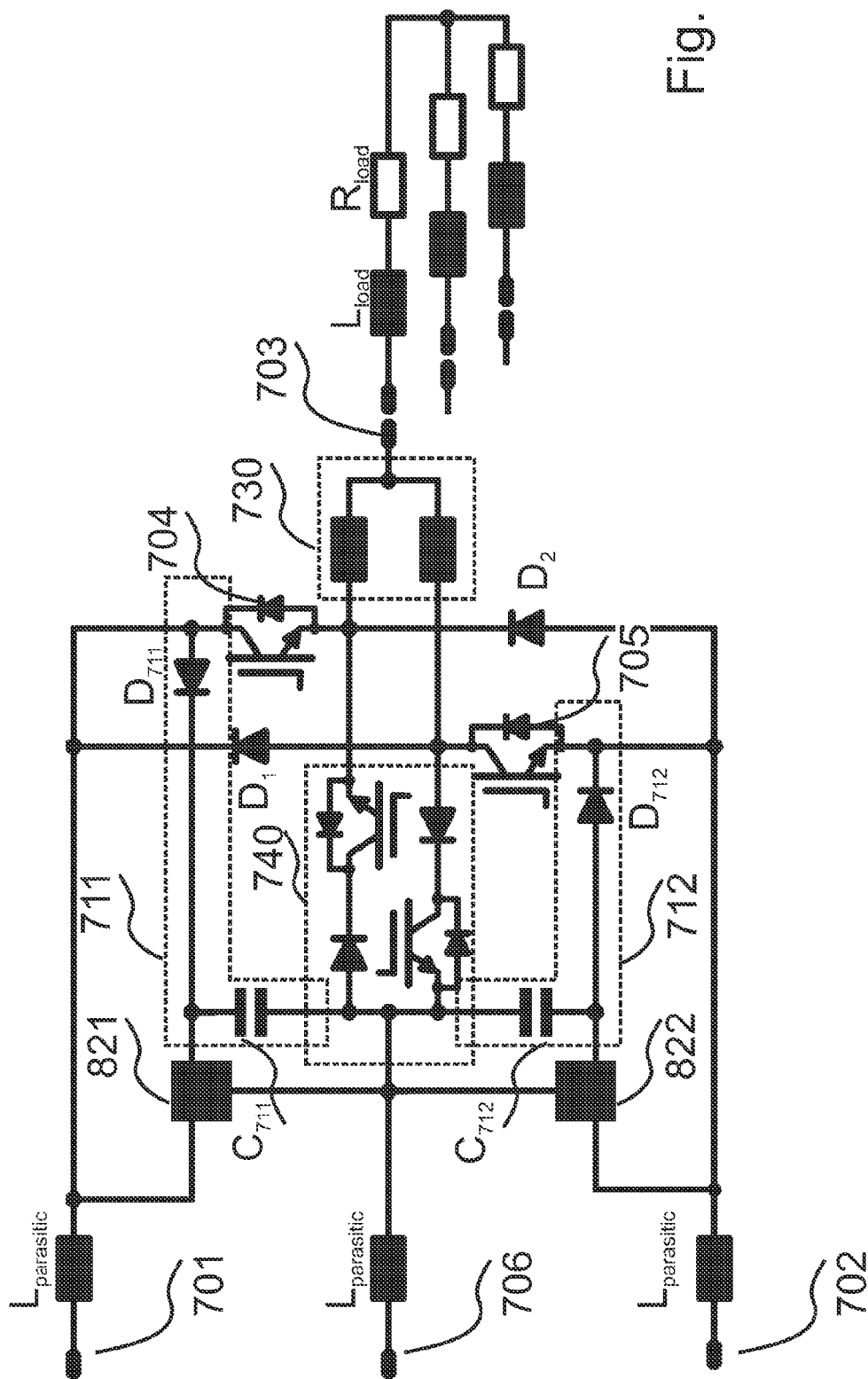
FIG. 8 illustrates a circuit diagram of the mixed-voltage NPC converter according to another exemplary embodiment of the invention.

Referring now to FIG. 8 an MNPC converter according to another exemplary embodiment of the invention is illustrated. The MNPC converter of FIG. 8 is based on the MNPC converter of FIG. 7 where corresponding parts are given corresponding reference numbers and terms. The detailed description of corresponding parts has been omitted for reasons of conciseness.

The MNPC converter of FIG. 8 differs from the MNPC converter of FIG. 7 in the first and the second active circuit 821 and 822.

In detail, the MNPC converter of FIG. 8 also includes a first and a second series circuit 711 and 712, each with a diode and capacitor respectively coupled between the positive input terminal 701 and the neutral terminal 706 and between negative input terminal 702 and the neutral terminal 706.

The diode D711 of the first series circuit 711 also allows temporarily storing in the capacitor C711 energy induced by the parasitic inductance when switching OFF the switching element 704. Similarly the diode D712 of the second series circuit 712 also allows temporarily storing in the capacitor C712 energy induced by the parasitic inductance when switching OFF the switching element 705.

To release the temporarily stored energy of the capacitors C711 or C712, the MNPC converter of FIG. 8 provides a first and a second intermediate DC/DC converter 821 and 822 controlling the release of the temporarily stored energy of the respective first or second capacitor C711 oar C712 of the first or second series circuit 711 or 712.

In more detail, the first intermediate DC/DC converter 821 includes a first and second terminal connected in parallel to the first diode D711 of the first series circuit 711 and includes a third terminal connected to the neutral terminal 706. The second intermediate DC/DC converter 822 includes a first and a second terminal connected in parallel to the diode D712 of the second series circuit 712 and includes a third terminal connected to the neutral terminal 706.

The first and second intermediate DC/DC converter 821 and 822 may be controlled so as to prevent temporarily stored energy from being released from the respective first or second capacitors C711 and C712 of the first or second series circuit 711, 712 when switching ON the respective first or second switching elements 704 or 705.

In other words the first intermediate DC/DC converter 821 may be controlled so as to prevent energy from flowing between the first and the second terminal when switching ON the first switching element 704. Further, the second intermediate DC/DC converter 822 may be controlled so as to prevent current from flowing between the first and the second terminal when switching ON the second switching element 705.

Further, the first and second intermediate DC/DC converters 821 and 822 may be controlled so as to convert the temporarily stored energy of the respective first or second capacitors C711 or C712 of the first or second series circuit 711 or 712 based ON the externally supplied DC input voltage for supplying the converted energy to the respective positive input or negative input terminal 701 or 702 when switching OFF the respective first or second switching element 704 or 705.

In more detail, upon the first intermediate DC/DC converter 821 detecting a voltage between the first and second input terminal, the intermediate DC/DC converter may be controlled so as to up-convert or down-convert the contained energy corresponding to the voltage between the positive input terminal 701 and neutral terminal 706 for supplying the converted energy to the respective positive input terminal 701 when switching OFF the first switching element 704.

Similarly, the second intermediate DC/DC converter 822 may upon detecting a voltage between the first and second input terminal, may be controlled so as to convert the energy corresponding to the voltage between the negative input terminal 702 and neutral terminal 706 for supplying the converted energy to the respective negative input terminal 702 when switching OFF the second switching element 705.

Consequently, the MNPC converter of FIG. 8 allows regenerating the stored energy of capacitors C711 and C712 with a intermediate DC/DC converter increasing the total efficiency of the MNPC converter circuit.

Thus, the combination of series circuit 711 and active circuit 821 as well as the combination of series circuit 712 and active circuit 822 allows preserving the positive effects of the parasitic inductance of the MNPC converter of FIG. 8 when switching ON the respective switching elements 705 while regenerating the stored energy when switching OFF the respective switching elements 704 or 705.

Furthermore, the MNPC converter according to the invention is not limited to the embodiments as shown in FIG. 7 or 8, but the arrangement of the active circuits 721, 722 and 821 and 822 can be easily adapted to achieve the advantages described with respect to FIGS. 2 and 4.

Figure 9:
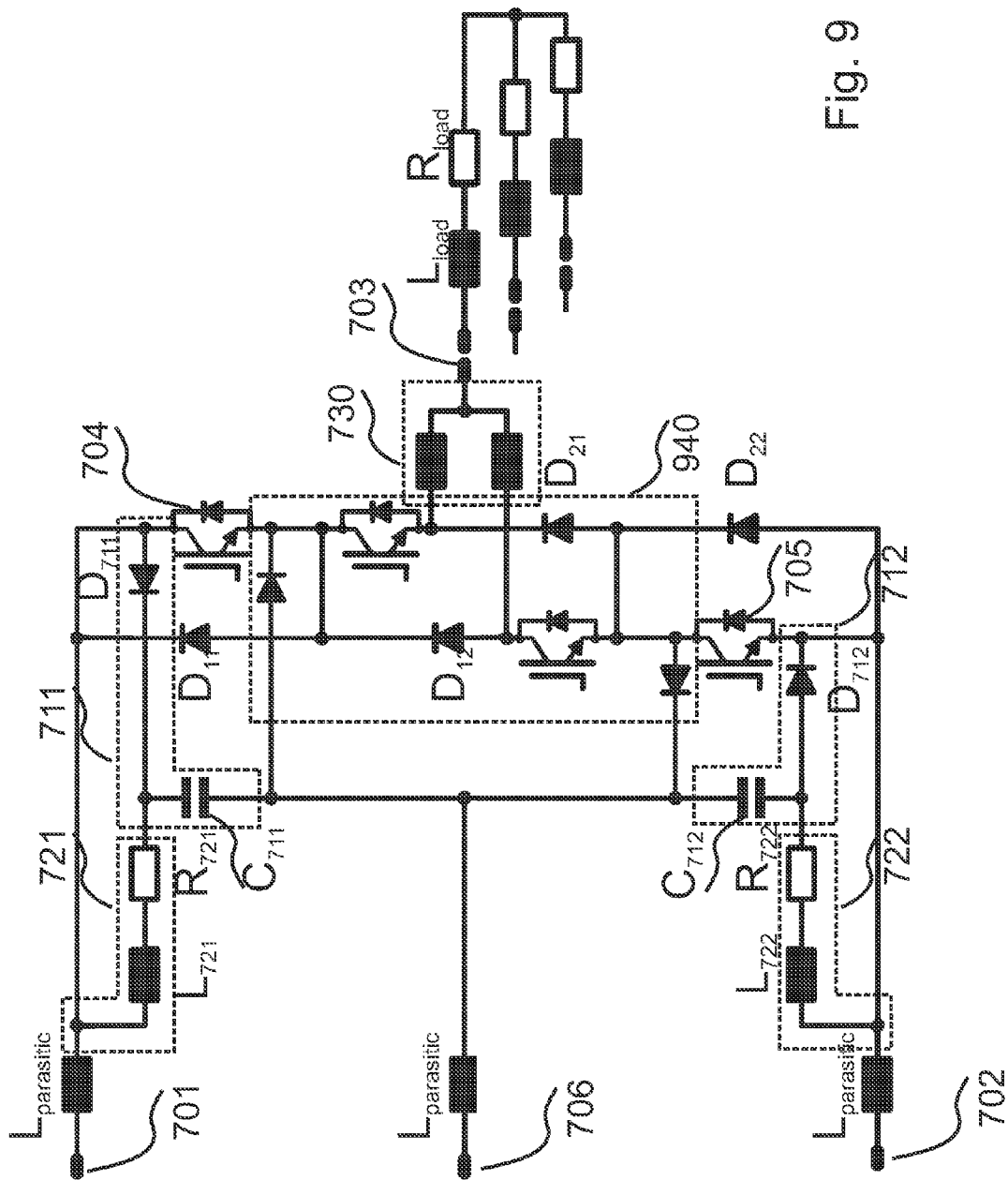
FIG. 9 illustrates a circuit diagram of a NPC converter according to another exemplary embodiment of the invention.

Referring now to FIG. 9, a circuit diagram of the NPC converter according to an exemplary embodiment of the invention is shown. The NPC converter of FIG. 9 is based on the NPC converter of FIG. 7 where corresponding parts are given corresponding reference numbers and terms. The detailed description of the corresponding parts has been omitted for reasons of conciseness.

In particular, the NPC converter of FIG. 9 differs from the NPC converter of FIG. 7 in the neutral point switching circuit 940 coupled between the neutral terminal 706 and in the output circuits 730 for providing a neutral voltage at the output terminal 703.

Figure 16:
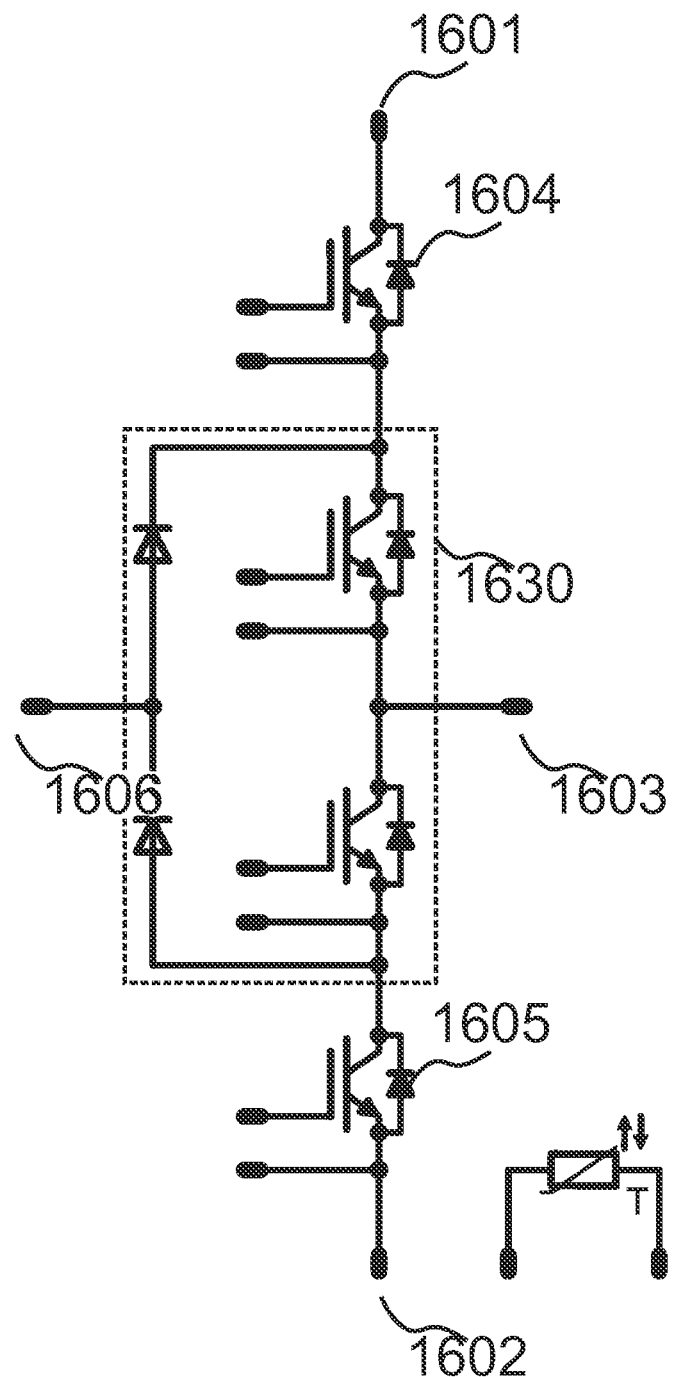
FIG. 16 schematically shows a fragmentation for implementing power module of an NPC converter according to an exemplary embodiment.

The neutral point switching circuit 940 of an NPC converter of FIG. 9 is very similar to that of FIG. 16 already discussed in the background of the invention. Accordingly, a detailed description thereof has been omitted for reasons of conciseness.

It is appreciated that the NPC converter of FIG. 9 also includes a combination of a first series circuit 711 and first active circuit 721, as well as a combination of a second series circuit 712 and a second active circuit 722 allow the preservation of the positive effects of the parasitic inductance of the NPC converter of FIG. 9 when switching ON respective switching elements 704 or 705 without adverse effects when switching OFF switching elements 704 or 705.

Figure 10:
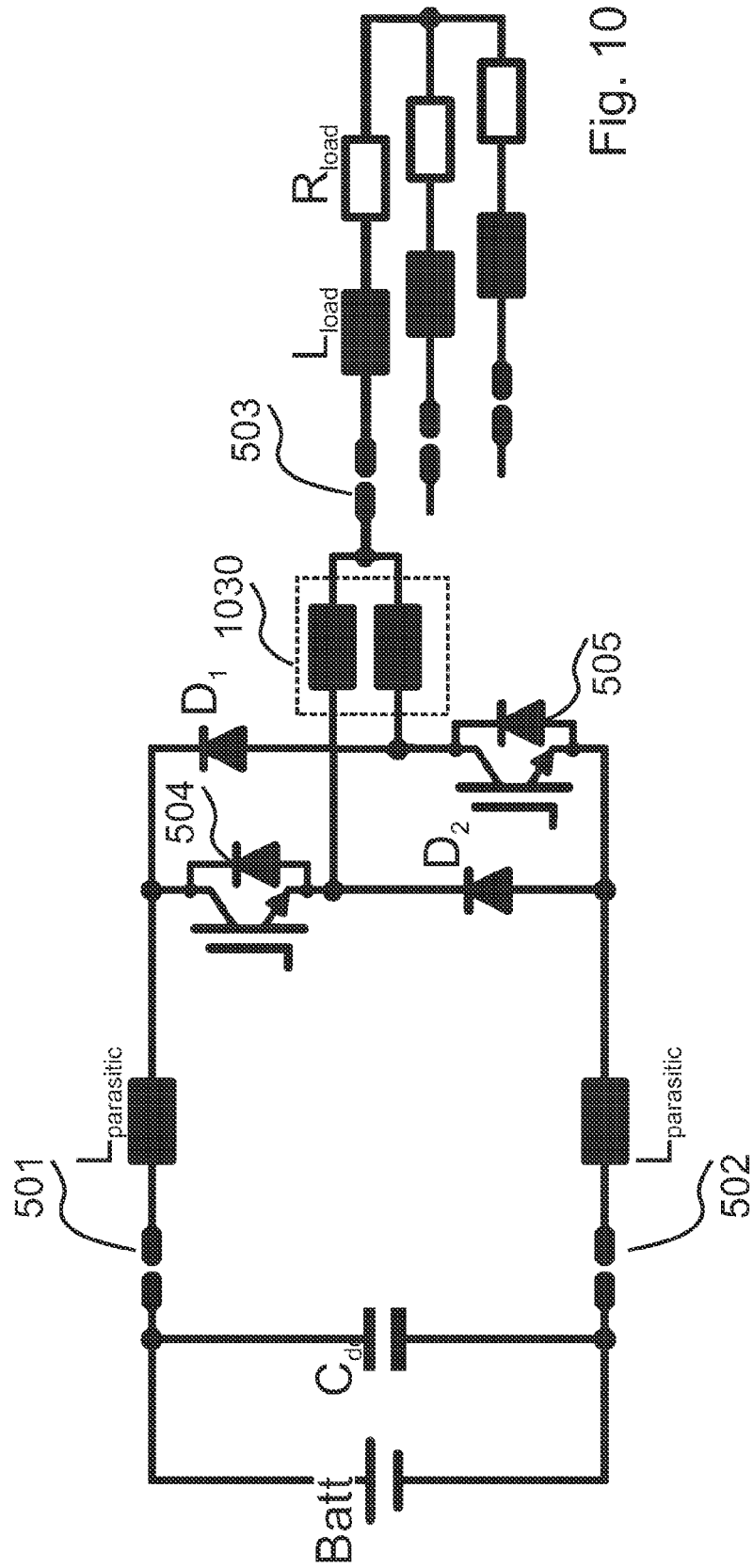
FIG. 10 illustrates a circuit diagram of a complementary switching regulator according to an exemplary embodiment of the invention.

Referring now to FIG. 10, an exemplary embodiment of a half-bridge converter according to the invention is shown. The half-bridge converter according to this embodiment can be used for converting a DC to an AC voltage. For this purpose, the half-bridge converter of FIG. 10 is supplied via a positive and a negative input terminal 501 and 502 with a DC input voltage.

The half-bridge converter according to FIG. 10 includes a first switching element 504 connected to the positive input terminal 501 for providing a positive input voltage via an output circuit 1030 at the output terminal 503. The half-bridge converter according to FIG. 10 further includes a second switching element 505 connected to the negative input terminal 502 for providing a negative input voltage via the output circuit 1030 at the output terminal 503. Each of the first and second switching elements 504 and 505 includes a body diode capable of conducting a freewheeling current in the case of an inductive load.

The output circuit 1030 includes a first and a second inductor respectively coupled between the first and the second switching element 504 and 505 and the output terminal.

In other words, when switching ON switching element 504 a current flows between positive input terminal 501, first switching element 504, first inductor of the output circuit 1030 and the output terminal 503. Further, when switching ON switching element 505 a current flows between negative input terminal 502, second switching element 505, second inductor of the output circuit 1030 and the output terminal 503.

In the half-bridge converter of FIG. 10, a first diode D1 is with its cathode terminal connected to the first input terminal 501 and with its anode terminal connected to a node interconnecting the second switching element 505 and the second inductor of the output circuit 1030. A second diode D2 is with its anode terminal connected to the second input terminal 502 and with its cathode terminal connected to another node interconnecting the first switching element 504 and the first inductor of the output circuit 1030.

Accordingly, the first switching element 504 and the second switching element 505 are provided on different conducting paths between the first and second input terminals 501 and 502. The different conducting paths for the first switching element 504 and for the second switching element 505 are decoupled via the output circuit from each other.

Consequently, the half-bridge converter of FIG. 10 prevents a switching current to flow through the first and the second switching element 504 and 505, namely the circuit eliminates cross-conduction during turn ON of either one of the first or second switching elements 504 and 505. This can be shown as follows:

Assuming a hypothetical cross-conduction current, the cross-conduction current would have to flow in the half-bridge converter of FIG. 10 through the first switching element 504, the first and second inductor of the output circuit 1030 and the second switching element 505 or vice versa. However, as the first and second inductor of the output circuit 1030 delay current with respect to the voltage, a recovery of the body diodes of the switching elements 504 or 505 is slowed down compared to the low inductively coupled diodes D1 and D2. Consequently, the body diodes of the first or second switching element 504 or 505 will not conduct a reverse recovery current when switching ON the complementary of the first or second switching element 504 or 505.

In other words, by decoupling the first and the second switching element 504 and 505 of the half-bridge converter of FIG. 10, it is possible to shift the reverse recovery current, when switching ON the first or second switching element 504 or 505, from the body diodes of the complementary first or second switching element 504 or 505 to the respective diodes D1 or D2, preventing the complementary first or second switching element 504 or 505 from temporarily turning ON, which could potentially be triggered by a capacitive voltage pulse to the gate-collector or gate-drain capacity of the complementary first or second switching element 504 or 505.

According to another, alternative embodiment, the half-bridge converter of FIG. 10 is adapted by substituting the output circuit 1030 including the first and the second inductor with an alternative output arrangement with the respective inductances resulting from connection as parasitic inductances. For instance, realizing the connection of the first and second switching element 504 and 505 to the output terminal 503 as screw connection would also result in an inductive decoupling of the first and second switching element 504 and 505.

The exemplary embodiment of the half-bridge converter of FIG. 10 also allows for a further modification to reduce the turn ON losses of the half-bridge converter: By choosing the diodes D1 and D2 so as to have a higher forward voltage drop than the body diodes included in the respective first and second switching element 504 and 505, the diodes are active during turn OFF. Accordingly, the freewheeling current is assigned to the body diodes of the respective first and second switching element 504 and 505.

Nevertheless, as the voltage difference that can be achieved by choosing a diode with a different forward voltage drop may be (for some applications) small in comparison to the potential difference effected by the induced freewheeling current, it will take time for the freewheeling current to adjust so that it only flow through the body diode of the respective first and second switching element 504 or 505 and not through diode D1 and D2.

Figure 11:
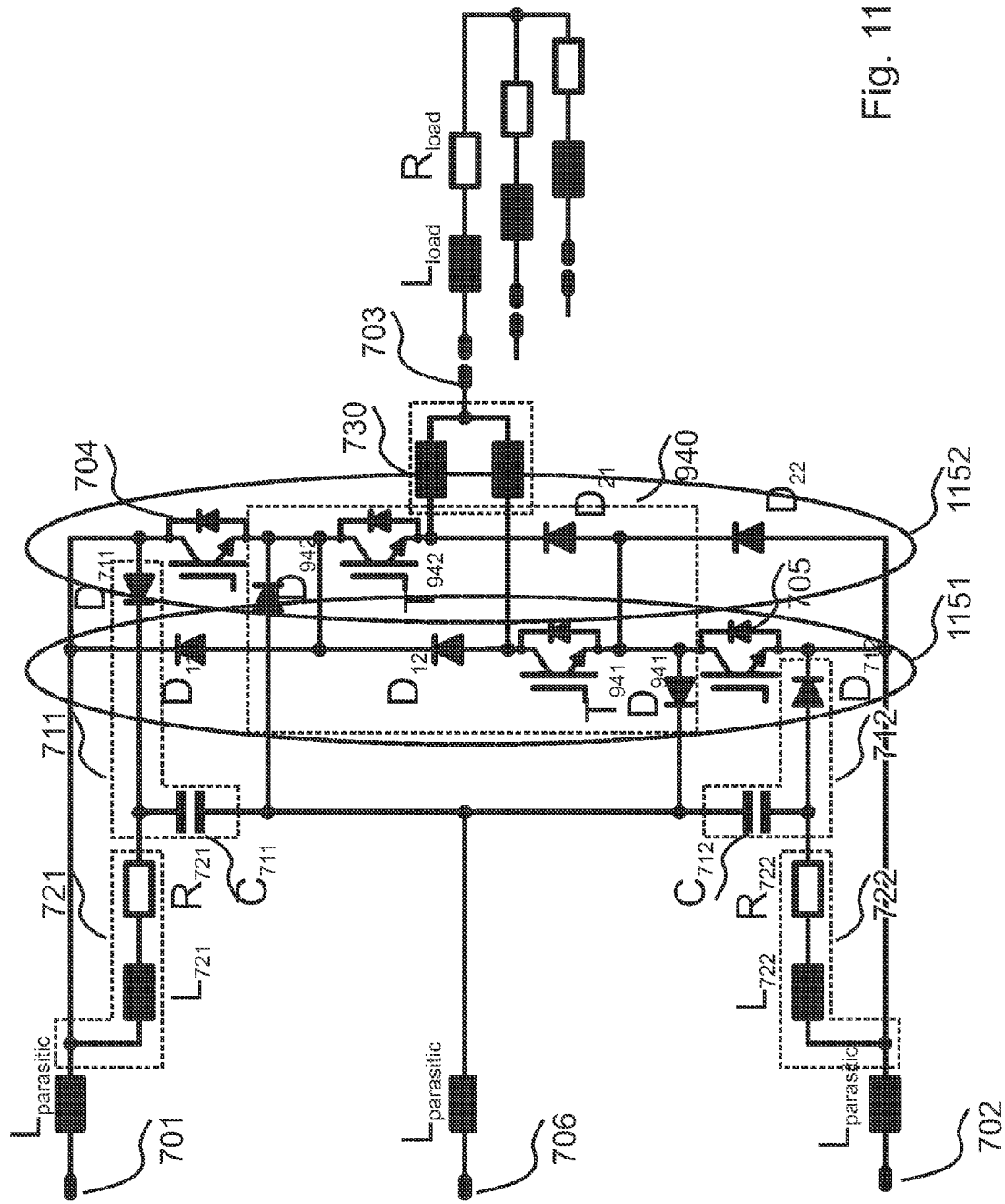
FIG. 11 indicates a power module design of a NPC converter according to an exemplary embodiment of the invention.
Figure 12:
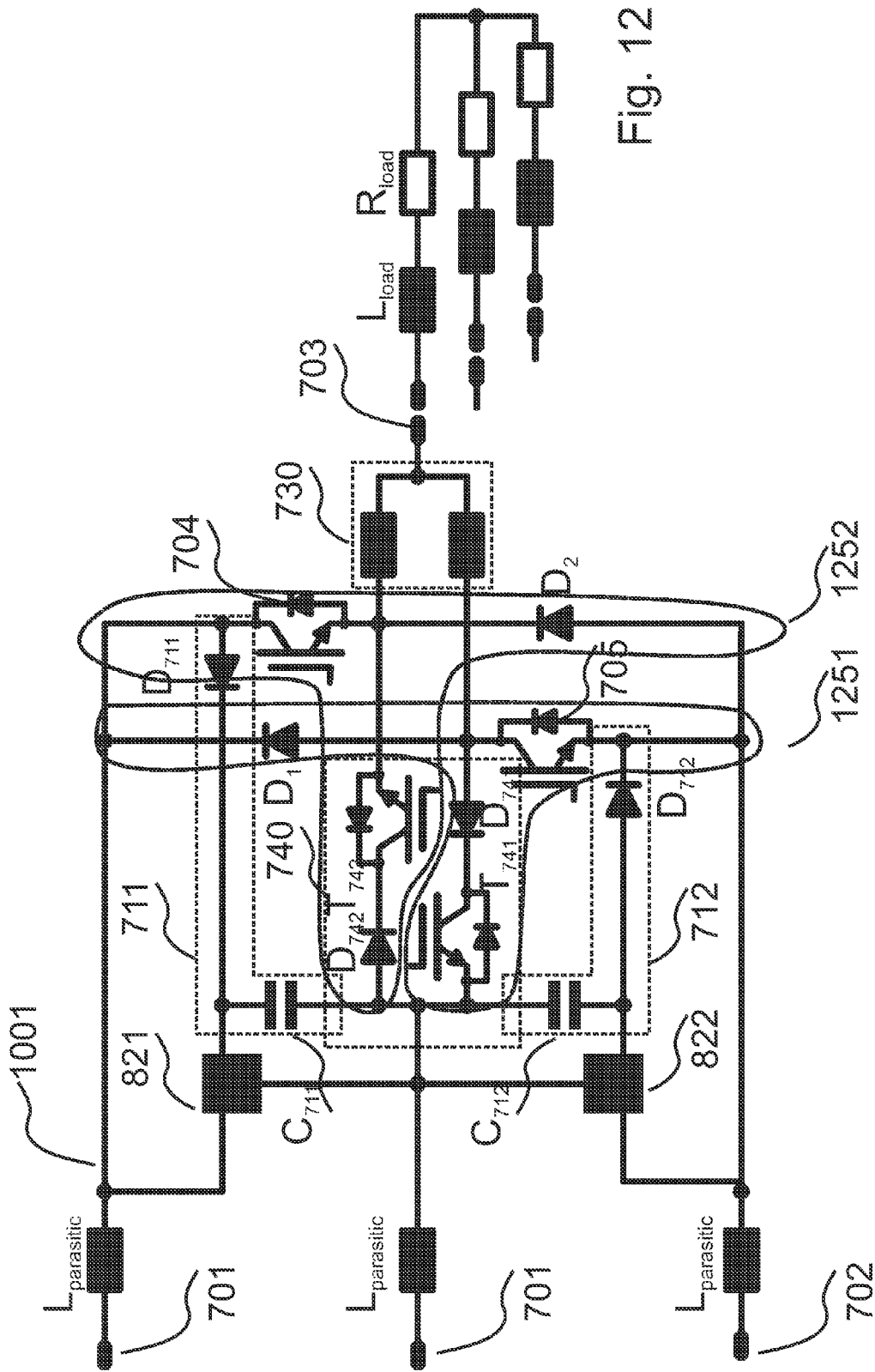
FIG. 12 shows a power module design of a mixed-voltage NPC converter according to an exemplary embodiment of the invention.
Figure 13:
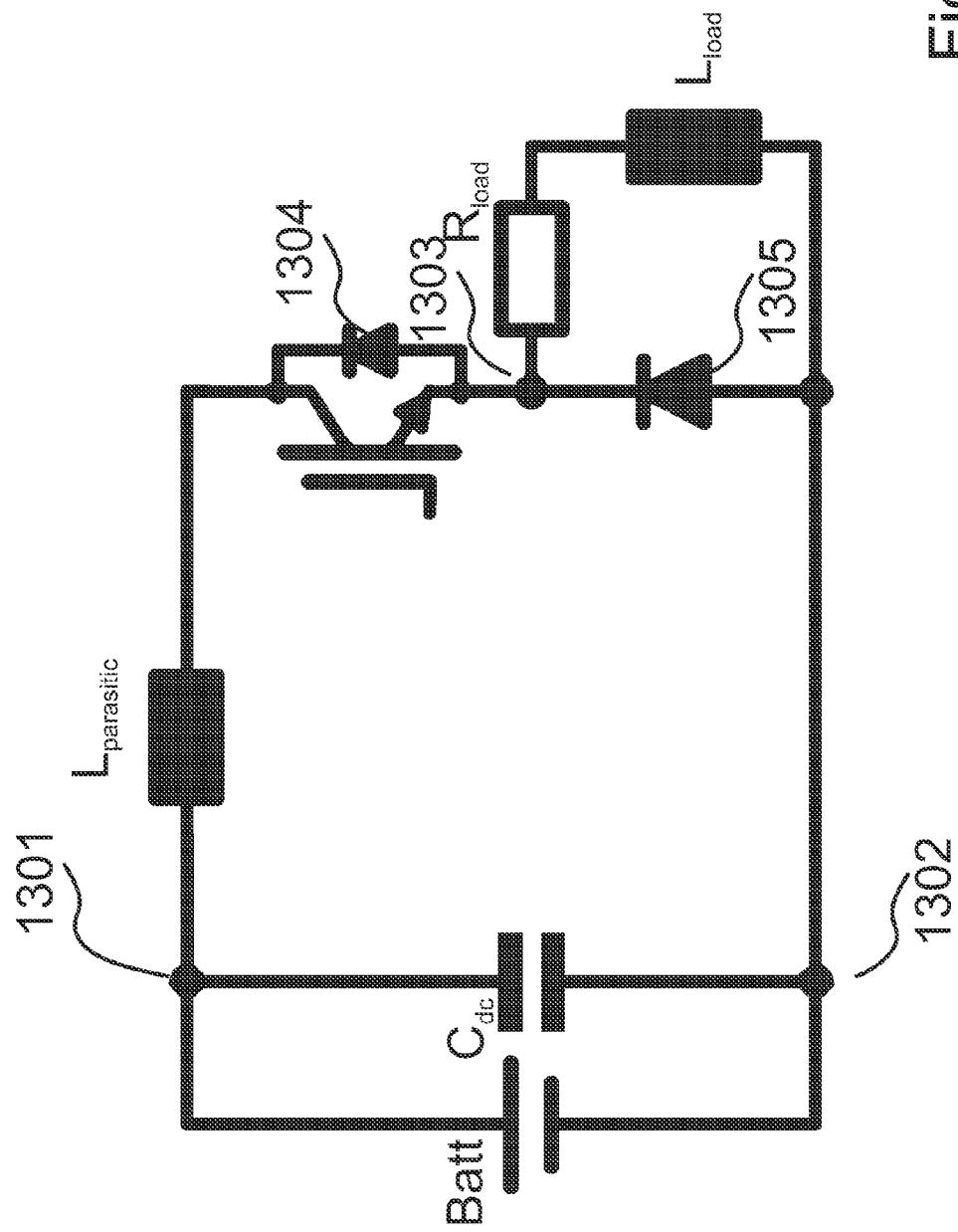
FIG. 13 illustrates a circuit diagram of a DC/DC converter according to another exemplary embodiment.
Figure 14:
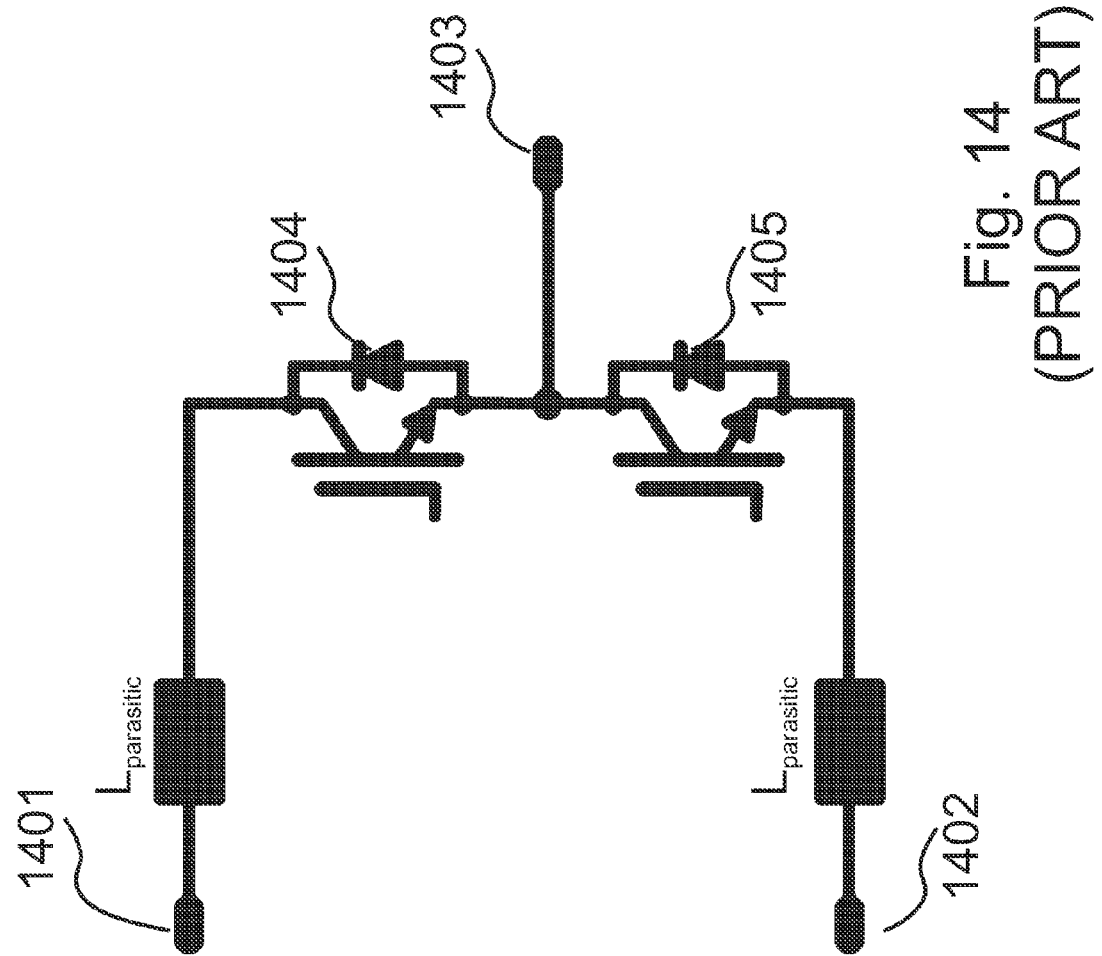
FIG. 14 illustrates a circuit diagram of a half-bridge converter according to an exemplary embodiment.
Figure 15:
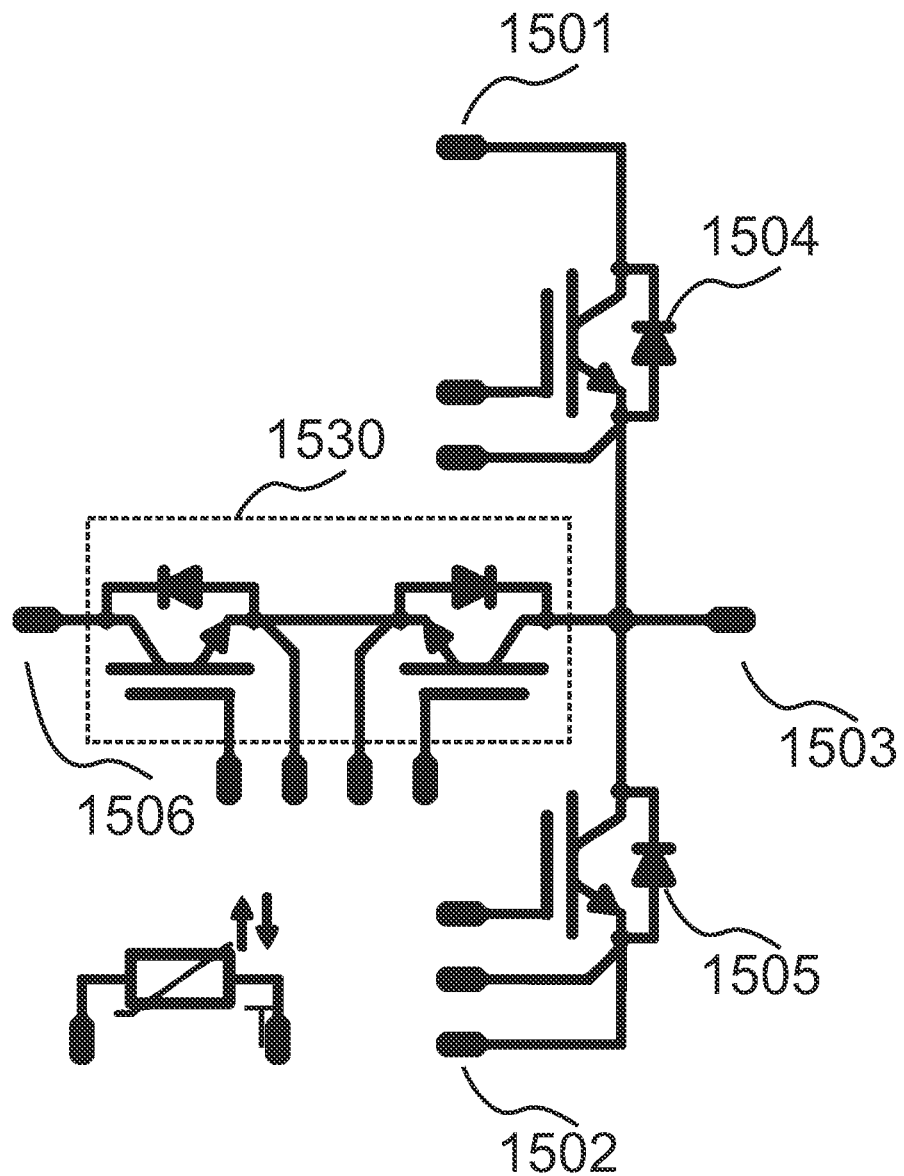
FIG. 15 schematically shows a fragmentation for implementing power module of a mixed-voltage NPC converter according to an exemplary embodiment.

Referring now to FIGS. 11 and 12, an exemplary realization of NPC converters of FIGS. 8 and 9 is indicated.

When designing a power module, it is the general approach to minimize the inductive coupling in the circuit by, for example, adapting the geometrical arrangement of the circuit components minimizing the distance to each other, adjusting the partitioning of the circuit to form as few as possible hardware modules or power substrates, and utilizing interconnections between hardware components with as little as possible parasitic inductances, e.g. copper wiring on a ceramic layer, coax cable between modules/power substrates or twisted pair cable between modules/power substrates.

In contrast, the implementation of either one of the NPC converters of FIGS. 8 and 9, as indicated in FIGS. 11 and 12 makes use of the fact that a module design may deliberately utilize a parasitic inductances resulting from a non-optimal distance of components to each other, a grouping of circuit components on different power modules or power substrates or a use of interconnections with a high inductance. For example, a high current conducting connection (i.e. a screw contact connection) introduces a high inductive coupling.

For the implementation of either one of the NPC converters of FIGS. 8 and 9, as indicated in FIGS. 11 and 12, it may be necessary to arrange components on different power substrates or in different power modules. In this case, it is possible to arrange the components so as to generate "parasitic" inductances at positions where the inductances may have a positive influence ON the performance of the circuit.

In more detail, the realization of the NPC converter of FIG. 11 arranges the first switching element 704 in group 1152 and the second switching element 705 in group 1151. Groups 1151 and 1152 correspond to different power substrates or different power modules in the realization of the NPC converter of FIG. 11.

In particular, group 1151 comprises the following components: diodes D11, D12, transistor T941, the first switching element 705 and diodes D941. The group 1152 comprises the following components: diodes D21, D22, transistor T942, the second switching element 704 and diode D942. For each of the groups 1151 and 1152, the inductive coupling is minimized between the comprised components.

The connection to components outside each group 1151 and 1152 does not require a minimization of the inductive coupling. For example, the connection of components between the two groups 1151 and 1152 may introduce some inductance.

It is of particular importance that the connection of the first or second series circuit 711 or 712 to the corresponding second or first group 1152 and 1151. Minimizing the indicative coupling of the first and second capacitor C711 and C712 of the first and second series circuit 711 and 712 to the corresponding second or first group of components 1152 or 1151 improves amount of energy temporarily stored in capacitors C711 and C712 and, hence, improves the efficiency of the NPC converter of FIG. 11. Consequently, the connections of the first and second capacitor C711 and C712 to the corresponding second or first group of components 1152 or 1151 should be as low inductive as possible or the first or second series circuit 711 or 712 have to be incorporated into the corresponding second or first group of components 1152 or 1151.

Further, the realization of the MNPC converter of FIG. 12 arranges the first switching element 704 in a group 1252 and the second switching element 705 in a group 1251. Groups 1251 and 1252 correspond to different power substrates or different power modules in the realization of the MNPC converter of FIG. 12.

In particular, group 1251 comprises the following components: diode D1, transistor T741, the first switching element 705 and diodes D741. The group 1252 comprises the following components: diodes D2, transistor T742, the second switching element 704 and diode D742. For each of the groups 1251 and 1252, the inductive coupling is minimized between the comprised components.

The connection to components outside each group 1251 and 1252 does not require a minimization of the inductive coupling. For example, the connection of components between the two groups 1251 and 1252 may introduce some inductance.

It is of particular importance that the connection of the first or second series circuit 711 or 712 to the corresponding second or first group 1252 and 1251. Minimizing the indicative coupling of the first and second capacitor C711 and C712 of the first and second series circuit 711 and 712 to the corresponding second or first group of components 1252 or 1251 increases amount of energy temporarily stored in capacitors C711 and C712 and, hence, improves the efficiency of the NPC converter of FIG. 12.

Consequently, the connections of the first and second capacitor C711 and C712 to the corresponding second or first group of components 1252 or 1251 should be as low inductive as possible or the first or second series circuit 711 or 712 have to be incorporated into the corresponding second or first group of components 1252 or 1151.

Figure 17:
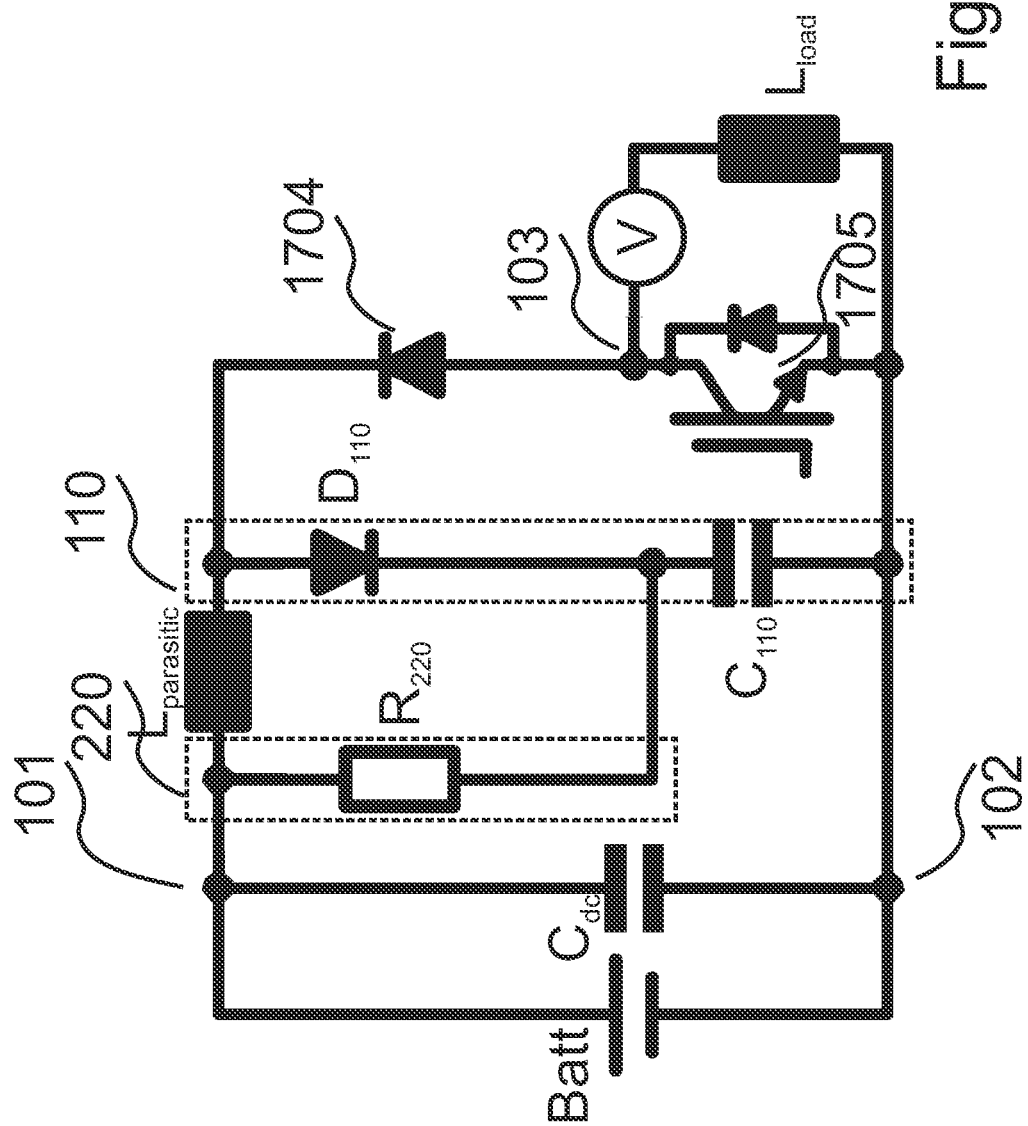
FIG. 17 illustrates a circuit diagram of a DC/DC converter according to an exemplary embodiment of the invention.

Referring now to FIG. 17, an alternative embodiment of the DC/DC converter according to the invention is illustrated. The DC/DC converter of FIG. 17 is based on the DC/DC converter of FIG. 2 where corresponding parts are given corresponding reference numerals and terms. The detailed description of corresponding parts has been omitted for reasons of conciseness.

The DC/DC converter of FIG. 17 differs from the DC/DC converter of FIG. 2 in that a switching element 1705 is coupled to the second input terminal 102 for providing a low voltage at the output terminal 103 and that a freewheeling diode 1704 coupled between the first input terminal 101 and the output terminal 103. In case of an inductive load as indicated by inductor $L_{load}$ in the exemplary embodiment of FIG. 17, the switching OFF of the switching element 1705 results in the inductive load $L_{load}$ inducing a freewheeling current. This freewheeling current is conducted by the freewheeling diode 1704.

Further, the DC/DC converter of FIG. 17 is connected to an active inductor, represented by a series circuit of a voltage source and inductor $L_{load}$.

As the DC/DC converter also includes a same series circuit 110 and a same active circuit 220 as described in reference to FIG. 2, combination of the series circuit 110 and the active circuit 220 also allows preserving the positive effects of the parasitic inductance of the DC/DC converter of FIG. 17 when switching ON switching element 104, without adverse effects when switching OFF switching element 1705.

According to another embodiment, the circuit of the DC/DC converter may be utilized as DC/DC booster or in an active PFC-booster. For this purpose, the terminals 103 and the terminal 102 or 101 are used as first and second input terminals and the respective other terminal 101 or 102 is used as output terminal. Accordingly, the DC/DC converter of FIG. 17 may be employed for charging a battery.

Figure 18:
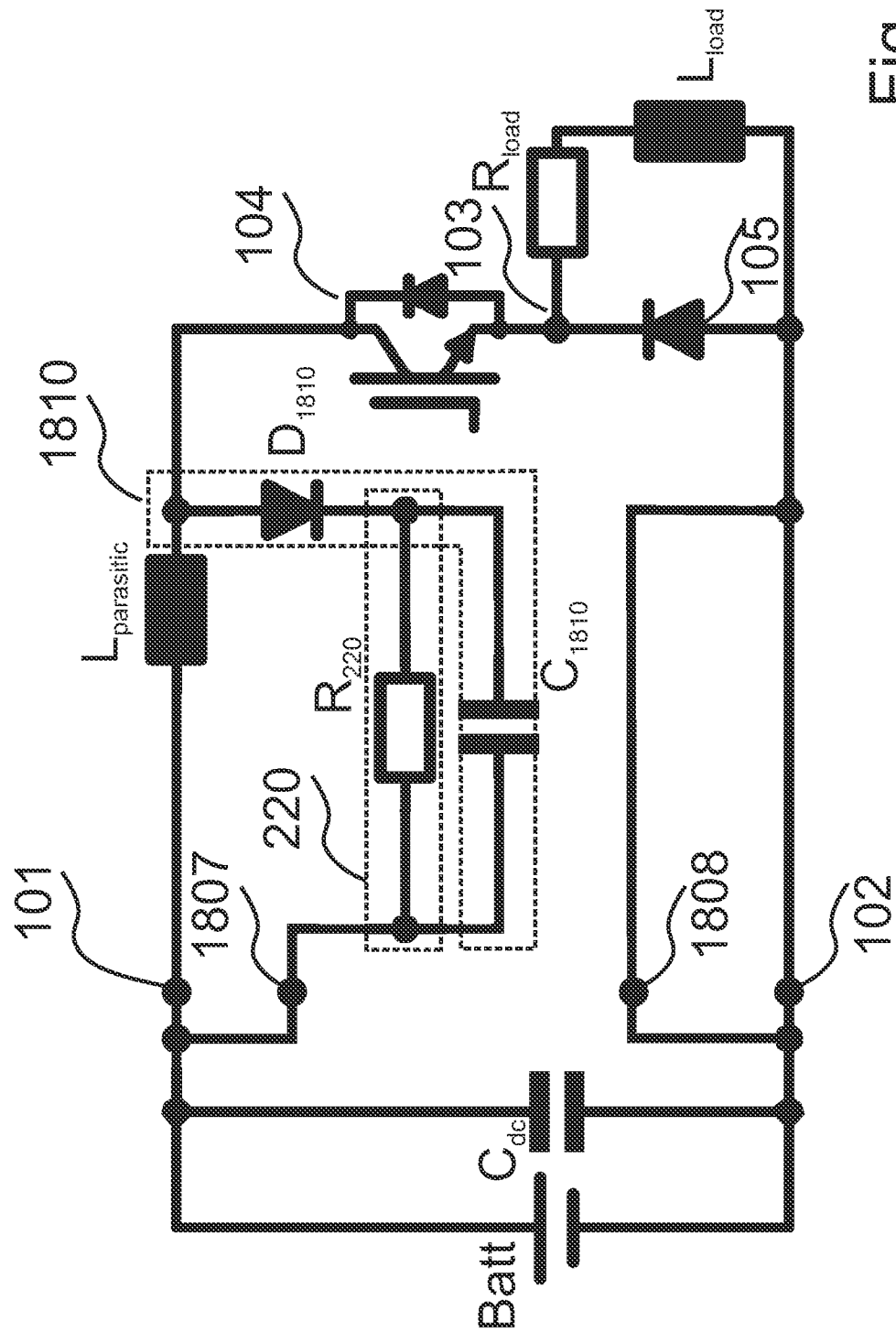
FIG. 18 illustrates a circuit diagram of a DC/DC converter according to an exemplary embodiment of the invention.

Referring now to FIG. 18, an alternative embodiment of the DC/DC converter according to the invention is shown. The DC/DC converter of FIG. 18 indicates the different connections of a DC/DC converter to the DC input voltage supply, e.g. Battery.

The DC/DC converter of FIG. 18 is based on the DC/DC converter of FIG. 2 where corresponding parts are given corresponding reference numerals and terms. The detailed description of corresponding parts has been omitted for reasons of conciseness.

The DC/DC converter of FIG. 18 differs from the DC/DC converter of FIG. 2 in the first series circuit.

In detail, the DC/DC converter of FIG. 18 also includes a first series circuit 1810 of a diode D1810 and a capacitor C1810. The first series circuit 1810 is connected between the first input terminal 101 and a third input terminal 1807. The first and the third input terminal 101, 1807 supplying the same voltage to the DC/DC converter. The first and the third input terminal 101, 1807 are both connected to the positive terminal of a DC power supply, whereas the second input terminal 102 is connected to the negative terminal of the DC power supply.

The first and the third input terminal 101 and 1807 differ in the amount of inductive coupling introduced. The first input terminal 101 is connected with a high amount of inductive coupling to the positive terminal of the DC power supply and the third input terminal 1807 is connected with a low amount of inductive coupling to the positive terminal of the DC input supply.

In the embodiment of FIG. 18, the different inductive coupling results from different connections. The connection via the first input terminal 101 may, for example, be realized as a high inductive current screw connection. The connection via the first input terminal introduces the parasitic inductance $L_{parasitic}$. The connection via the third input terminal 1807 may, for example, be realized as a low inductive, low current conducting coaxial cable or twisted-pair cable.

As an example, in the embodiment of FIG. 18, the DC/DC converter includes a fourth input terminal 1808 supplying the same potential as the second input terminal 102 for connecting the freewheeling element 105. With the fourth input terminal 1808 a complementary connection is provided to that of the third input terminal 1807 which may, for example, be respectively realized as low inductive, low reverse current conducting second wire of the coaxial cable or the twisted-pair cable.

When switching ON switching element 104, a current starts flowing between the first input terminal 101 and the output terminal 103. The parasitic inductance $L_{parasitic}$ of the DC/DC converter of FIG. 18 results in a delay of the current with respect to the voltage. In other words, the parasitic inductance reduces the current change rate, hence, advantageously contributing to a reduction of the turn ON losses in the DC/DC converter of FIG. 18.

The first series circuit 1810 of the DC/DC converter of FIG. 18 enables the current induced by the parasitic inductance $L_{parasitic}$ to circulate in a loop comprising the parasitic inductance $L_{parasitic}$, diode D1810, capacitor C1810 and the first and third input terminals 101 and 1807. Accordingly, the induced current may at least partially be temporarily stored in capacitor C1810 when switching OFF the switching element 104.

Further, the DC/DC converter of FIG. 18 includes active circuit 220 coupled in parallel with the diode D1810. The active circuit 220 controls the release of the temporarily stored energy of the capacitor C1810 of the first series circuit 1810 so that it does not eliminate the positive effect of the parasitic inductance when switching ON the switching element 104.

In particular, the active circuit 220 controls the release of the temporarily stored energy of the capacitor C1810 of the first series circuit 1810 so that it does not eliminate the positive effect of the parasitic inductance when switching ON the switching element 104.

In the DC/DC converter of FIG. 18, the active circuit 220 comprises a resistor R220. The resistor R220 is connected, via the first and the third input terminal 101 and 1807, in parallel to the diode D1810 of the first series circuit 1810. The resistor R220 is also connected in parallel to the capacitor C1810. Due to the resistor R220 of the active circuit 220 and the capacitor C1810 of the first series circuit being connected in parallel, the energy of the induced current of the parasitic inductance $L_{parasitic}$ may also at least partially dissipate in the resistor R220, when switching OFF the switching element 104. Further, the temporarily stored energy of the capacitor C1810 may also at least partially be dissipated by a current flowing in the conductive loop comprising the capacitor C1810 and the resistor R220.

Thereby, the temporarily stored energy is released from the capacitor C1810 of the first series circuit 1810 without adversely affecting the improved turn ON behaviour of the DC/DC converter of FIG. 18.

Consequently, the combination of series circuit 1810 and active circuit 220 also allows preserving the positive effects of the parasitic inductance of the DC/DC converter of FIG. 18 when switching ON switching element 104, without adverse effects when switching OFF switching element 104.

The invention claimed is:

1. A neutral point clamped (NPC) converter for converting a DC input voltage, supplied via a positive and a negative input terminal (701, 702) as a positive and a negative voltage with respect to a neutral terminal (706), to an AC output voltage at an output terminal (703), the NPC converter having a parasitic inductance and comprising:
   a first switching element (704) connected to the positive input terminal (701) for providing via an output circuit (730) a positive voltage at the output terminal (703);
   a second switching element (705) connected to the negative input terminal (702) for providing via the output circuit (730) a negative voltage at the output terminal;
   wherein the output circuit (730) comprises a first and a second inductor respectively coupled between the first and second switching element (704, 705) and the output terminal (703);
   a neutral point switching circuit (740; 940) coupled between the neutral terminal (706) and the output circuit (730) for providing a neutral voltage at the output terminal (703);
   a first series circuit (711) of a first diode and a first capacitor, the first series circuit being coupled between the positive input terminal (701) and the neutral terminal (706), wherein the first diode allows temporarily storing, in the first capacitor, energy induced by the parasitic inductance when switching OFF the first switching element (704);
   a second series circuit (712) of a second diode and a second capacitor, the second series circuit being coupled between the negative input terminal (702) and the neutral terminal (706), wherein the second diode allows temporarily storing, in the second capacitor, energy induced by the or another parasitic inductance when switching OFF the second switching element (705);
   a first active circuit (721; 821) coupled in parallel with the first diode of the first series circuit (711) for controlling the release of temporarily stored energy of the first capacitor of the first series circuit (710); and
   a second active circuit (722; 822) coupled in parallel with the second diode of the second series circuit (712) for controlling the release of temporarily stored energy of the second capacitor of the second series circuit (712).

2. The NPC converter according to claim 1, wherein the first and the second active circuit (721, 722) respectively comprise a third and fourth series circuit, each including a resistor and an inductor, connected in parallel to the respective first and second diode of the first or second series circuit (711, 712), the first and second active circuit (721, 722) preventing temporarily stored energy from being released from the respective first or second capacitor of the first or second series circuit (711, 712) when switching ON the respective first or second switching element (704, 705), and the first and second active circuit (721, 722) releasing the temporarily stored energy of the respective first and second capacitor of the first and second series circuit (711, 712) by at least partially dissipating temporarily stored energy in the respective resistor when switching OFF the respective first or second switching element (704, 705).

3. The NPC converter according to claim 1, wherein the first and second active circuit (821, 822) respectively comprise
   a first and second intermediate converter, each of the first and second intermediate converters being with a first and a second terminal connected in parallel to the respective first or second diode of the first or second series circuit (711, 712), and with a third terminal connected to the neutral terminal (706);

the first and second intermediate converter being controlled so as to prevent temporarily stored energy from being released from the respective first or second capacitor of the first and second series circuit (711, 712) when switching ON the respective first or second switching element (704, 705), and the first and second intermediate converter further being controlled so as to convert the temporarily stored energy of the respective first or second capacitor of the first or second series circuit (711, 712) based on the externally supplied DC input voltage for supplying the converted energy to the respective first input or second input terminal (701, 702) when switching OFF the respective first or second switching element (704, 705).

4. The NPC converter according to claim 1 further comprising:

a first circuit comprising at least one first diode (D1; D11, D12) coupled between the positive input terminal (701) and a first node though which the second switching element (705) provides the negative voltage to the output circuit (730), the at least one first diode (D1; D11, D12) enabling current to pass from the output circuit (730) to the positive input terminal (701); and a second circuit comprising at least one second diode (D2; D21, D22) coupled between the negative input terminal (702) and a second node though which the first switching element (704) provides the positive voltage to the output circuit (730), the at least one second diode (D2; D21, D22) enabling current to pass from the negative input terminal (702) to the output circuit (730).

* * * * *